United States Patent
Kinjo et al.

(10) Patent No.: US 9,106,104 B2
(45) Date of Patent: Aug. 11, 2015

(54) POWER CONTROL DEVICE, POWER CONTROL METHOD, AND POWER SUPPLY SYSTEM

(75) Inventors: Tatsuto Kinjo, Osaka (JP); Mitsuru Kaji, Osaka (JP); Takahiro Kudoh, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 406 days.

(21) Appl. No.: 13/508,413

(22) PCT Filed: Sep. 7, 2011

(86) PCT No.: PCT/JP2011/005024
§ 371 (c)(1),
(2), (4) Date: May 7, 2012

(87) PCT Pub. No.: WO2012/032776
PCT Pub. Date: Mar. 15, 2012

(65) Prior Publication Data
US 2012/0223670 A1 Sep. 6, 2012

(30) Foreign Application Priority Data
Sep. 10, 2010 (JP) ................................ 2010-203213

(51) Int. Cl.
*H02J 7/00* (2006.01)
*H02J 7/35* (2006.01)
(Continued)

(52) U.S. Cl.
CPC ............... *H02J 7/35* (2013.01); *H01M 10/441* (2013.01); *H01M 10/443* (2013.01); *H02J 3/32* (2013.01); *G01R 31/3679* (2013.01)

(58) Field of Classification Search
CPC .... Y02E 60/12; H02J 7/14232; H02J 7/1438; H02J 2007/004; H02J 2007/0095; Y02T 10/92; Y02T 10/6286; B60L 11/1861; H01M 10/44; H01M 2010/4271; G01R 31/3675; G01R 31/3679; B60K 6/28; F02N 11/0862
USPC .................................................. 320/103, 135
See application file for complete search history.

(56) References Cited

U.S. PATENT DOCUMENTS 6,075,346 A  6/2000  Kikuchi et al.
7,085,661 B2 *  8/2006  Emori et al. .................... 702/63
(Continued)

FOREIGN PATENT DOCUMENTS

JP   11-187577   7/1999
JP   2008-109840   5/2008
(Continued)

OTHER PUBLICATIONS

International Search Report issued Dec. 20, 2011 in International (PCT) Application No. PCT/JP2011/005024.

*Primary Examiner* — Sun Lin
(74) *Attorney, Agent, or Firm* — Wenderoth, Lind & Ponack, L.L.P.

(57) ABSTRACT

The control device includes: an acquisition unit which acquires voltage information indicating a voltage applied to a capacitor provided between a power generation unit and a load via first and second power supply lines, and deterioration information indicating a state of deterioration of a storage battery connected to the power generation unit; a determination unit which compares the acquired voltage information with a reference voltage so as to detect a fluctuation of the voltage, and determines power to be outputted so as to suppress the fluctuation; and an informing unit which informs the storage battery of a current value corresponding to the power to be outputted, wherein the determination unit detects the state of deterioration of the storage battery using the deterioration information, and determines power to be outputted in accordance with the state of deterioration.

11 Claims, 22 Drawing Sheets

(51) Int. Cl.
*H02J 3/32* (2006.01)
*H01M 10/44* (2006.01)
*G01R 31/36* (2006.01)

(56) References Cited

U.S. PATENT DOCUMENTS

| | | | |
|---|---|---|---|
| 7,406,389 B2 * | 7/2008 | Emori et al. | 702/85 |
| 7,952,224 B2 | 5/2011 | Sawada et al. | |
| 8,080,898 B2 | 12/2011 | Fukuhara | |
| 2008/0224541 A1 | 9/2008 | Fukuhara | |
| 2010/0096918 A1 | 4/2010 | Sawada et al. | |
| 2010/0207587 A1 | 8/2010 | Oyobe et al. | |

FOREIGN PATENT DOCUMENTS

| | | |
|---|---|---|
| JP | 2008-154302 | 7/2008 |
| JP | 2008-154334 | 7/2008 |
| JP | 2008-236821 | 10/2008 |
| JP | 2009-159730 | 7/2009 |
| JP | 2010-016956 | 1/2010 |

* cited by examiner

POWER CONTROL DEVICE, POWER CONTROL METHOD, AND POWER SUPPLY SYSTEM

TECHNICAL FIELD

The present invention relates to a power control device which supplies stable power to a load.

BACKGROUND ART

In recent years, power supply systems using renewable energy such as sunlight and wind power have been researched. Such power supply systems each generate power using renewable energy such as sunlight and wind power in a facility, for example, a building, a factory, or a household. In each facility, there are installed one or more storage batteries which store generated power, and a cooperative ECU (Electronic Control Unit) which controls charging and discharging of the storage batteries. Various electric appliances such as a refrigerator, a television, and an electric vehicle installed in each facility can be operated utilizing the power stored in a plurality of storage batteries.

However, in a power supply system, an increased variation in the frequencies of charging and discharging to and from the storage batteries causes a variation in the power that can be charged to the storage batteries. A storage battery cannot be used once rechargeable power amount of the storage battery falls below a certain value. Therefore, a variation in the life spans of the storage batteries occurs.

For example, when one of a plurality of storage batteries becomes unusable, the remaining usable storage batteries tend to have an increased load. Consequently, the remaining storage batteries also become unusable one after another. Thus, there is a problem in that a deterioration of the entire storage batteries proceeds in this manner.

Conventionally, there has been known a method in which a cooperative ECU detects a temperature and a voltage of each storage battery as an indicator of the quantity-of-state of the storage battery in order to reduce a variation in the life spans of the storage batteries by making the remaining capacities thereof uniform. The remaining capacity of each storage battery can be estimated by detecting a temperature and a voltage of the storage battery. When a storage battery is charged or discharged, a cooperative ECU detects a temperature and a voltage of the storage battery so as to calculate the remaining capacity thereof. The distribution ratio of the power that is charged or discharged to or from each storage battery is calculated in accordance with the ratio of the remaining capacity of the storage battery. For example, when a storage battery is discharged, large power is discharged from a storage battery with a large remaining capacity, and conversely, small power is discharged from a storage battery with a small remaining capacity in accordance with the ratio of the remaining capacity. Thus, a variation in the remaining capacities of the storage batteries can be reduced by calculating a distribution ratio of the power that is charged or discharged to or from each storage battery in accordance with the ratio of the remaining capacity (for example, Patent Literature 1).

CITATION LIST

Patent Literature

[PTL 1]
Japanese Unexamined Patent Application Publication No. 2008-154302

SUMMARY OF INVENTION

Technical Problem

However, the following problem occurs in the above-described conventional art.

That is to say, in the above-described conventional art, power is supplied from each storage battery to a load device via a capacitor which connects a positive polarity power line and a negative polarity power line so as to operate an appliance. Then, in order to supply stable power to the appliance, the voltage applied to the capacitor needs to be constant. Here, because a load device is assumed to serve as a three phase load or a balanced three phase load in the above-described conventional art, the amount of power supply from the storage batteries and the amount of power consumption of the load device are the same. In this case, the amount of power flowing into the above-mentioned capacitor and the amount of power flowing out the capacitor are substantially the same. Therefore, a fluctuation in the voltage applied to the above-mentioned capacitor is a little. For this reason, the appliance can be operated normally without consideration of the fluctuation component.

However, in a power supply system using renewable energy, the amount of generated power is not constant and a fluctuation in the amount of generated power occurs. This is because the intensity of the sunlight and wind power is unstable. Accordingly, the voltage applied to the capacitor varies due to the fluctuation component. Consequently, the amount of power generated from renewable energy and the amount of power consumption of the load device are not matched.

Particularly, in the case where the above-mentioned load device serves as a single phase load, a voltage fluctuation of a specific frequency component is superimposed on the voltage applied to the capacitor in accordance with a system frequency of an AC current which flows when power to the single phase load is supplied. For example, in a 60 Hz system frequency, a 120 Hz frequency component is superimposed as a voltage fluctuation. Consequently, there is a problem in that the power supply to a load device which is provided in each facility becomes unstable because of the above-mentioned voltage fluctuation.

Thus, the present invention has been made in view of the above-mentioned problem, and it is an object of the invention is to provide a power control device which supplies stable power to a load while reducing deterioration of the storage batteries.

Solution to Problem

In order to solve the above-described problem, one aspect of the present invention is a power control device including: an acquisition unit that acquires voltage information and deterioration information, the voltage information indicating a voltage applied to a capacitor provided between a power generation unit and a load via a first power supply line and a second power supply line, the deterioration information indicating a state of deterioration of a storage battery connected to the power generation unit via the first power supply line and the second power supply line; a determination unit that compares the voltage information acquired by the acquisition unit with a predetermined reference voltage so as to detect a fluctuation of the voltage applied to the capacitor, and determines power to be outputted by the storage battery, so as to suppress the fluctuation of the voltage applied to the capacitor; and an informing unit that informs the storage battery of a current value corresponding to the power to be outputted by the storage battery, wherein the determination unit detects the state of deterioration of the storage battery using the deterioration information acquired by the acquisition unit, and determines power to be outputted per unit of time by the storage battery by adjusting a charge time or a discharge time of the storage battery in accordance with the state of deterioration of the storage battery.

With this configuration, the power control device can reduce a fluctuation in the voltage applied to the capacitor by charging or discharging the storage battery. At the same time, a load to a storage battery with more deterioration can be reduced by adjusting charge time or discharge time in accordance with the state of deterioration of the storage battery. Consequently, stable power can be supplied to a load while reducing deterioration of the storage battery.

The present invention is achieved not only as a power control device but also as a power control method having steps performed by characteristic unit included in the power control device, or as a program which causes a computer to execute such characteristic steps. Furthermore, it is needless to say that such a program can be distributed via a recording medium such as a CD-ROM (Compact Disc Read Only Memory), and a transmission medium such as the Internet.

In addition, the present invention can be achieved as a semiconductor integrated circuit (LSI) which implements part or all of the functions of such a power control device, or as a power supply system which includes the power control device.

Advantageous Effects of Invention

As described above, the present invention can provide a power control device which supplies stable power to a load while reducing deterioration of a storage battery.

DESCRIPTION OF EMBODIMENTS

Figure 1:
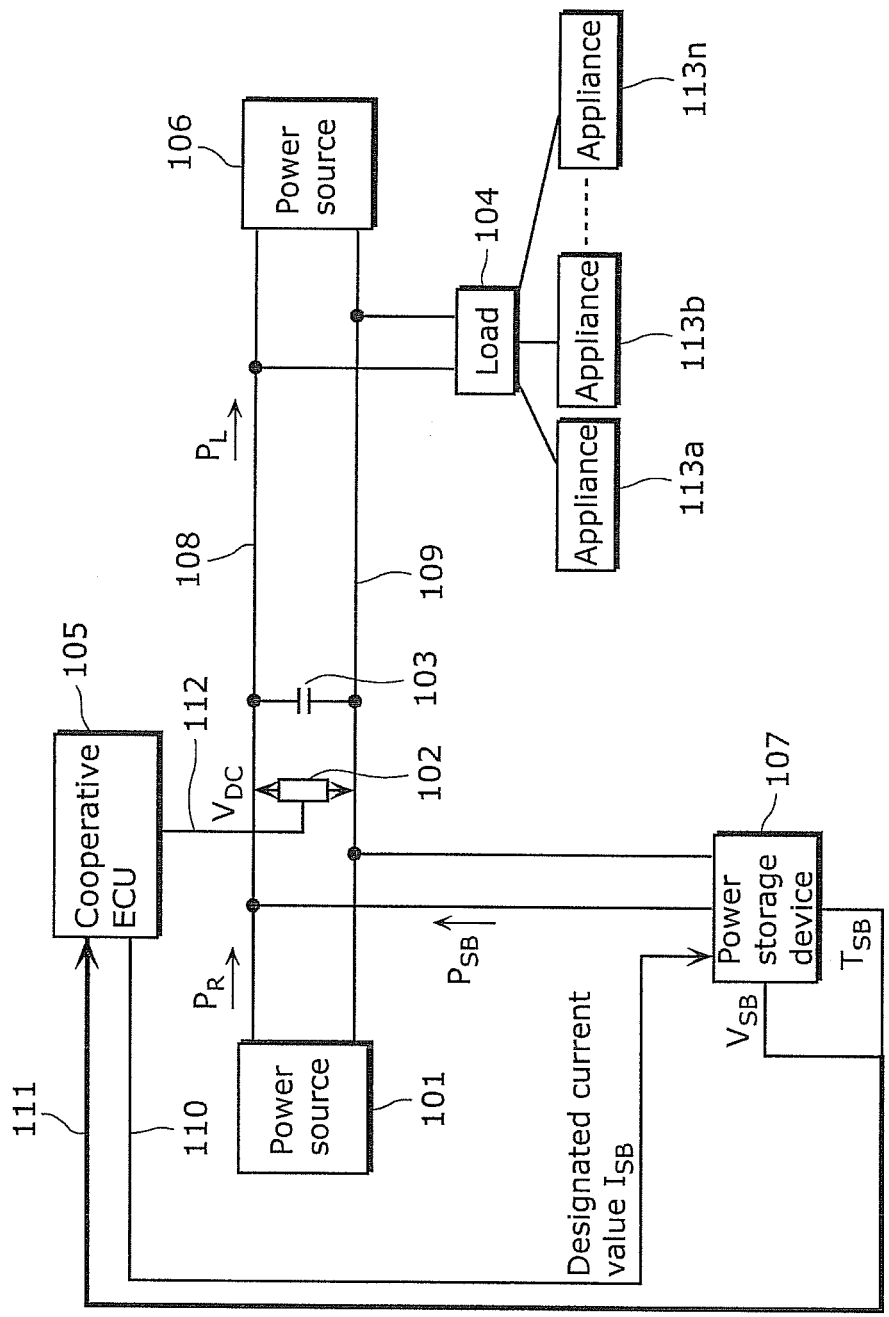
FIG. 1 is a system configuration diagram illustrating a power supply system according to Embodiment 1 of the present invention.

One aspect of the present invention is a power control device including: an acquisition unit that acquires voltage information and deterioration information, the voltage information indicating a voltage applied to a capacitor provided between a power generation unit and a load via a first power supply line and a second power supply line, the deterioration information indicating a state of deterioration of a storage battery connected to the power generation unit via the first power supply line and the second power supply line; a determination unit that compares the voltage information acquired by the acquisition unit with a predetermined reference voltage so as to detect a fluctuation of the voltage applied to the capacitor, and determines power to be outputted by the storage battery, so as to suppress the fluctuation of the voltage applied to the capacitor; and an informing unit that informs the storage battery of a current value corresponding to the power to be outputted by the storage battery, wherein the determination unit detects the state of deterioration of the storage battery using the deterioration information acquired by the acquisition unit, and determines power to be outputted per unit of time by the storage battery by adjusting a charge time or a discharge time of the storage battery in accordance with the state of deterioration of the storage battery.

With this configuration, the power control device can reduce a fluctuation in the voltage applied to the capacitor by charging or discharging the storage battery. At the same time, a load to a storage battery with more deterioration can be reduced by adjusting charge time or discharge time in accordance with the state of deterioration of the storage battery. Consequently, stable power can be supplied to a load while reducing deterioration of the storage battery.

Specifically, the deterioration information may be a value which is calculated as a value corresponding to at least one of a voltage value and a temperature value of the storage battery.

With this configuration, the power control device can calculate SOC (State of Charge) which indicates the charge state of a storage battery and SOH (State of Health) which indicates the state of deterioration of a storage battery based on the values measured from the storage battery. In addition, the power control device can successively determine the current to be outputted from each storage battery in order to reduce (i.e., compensate to near a zero) a fluctuation component of the DC link voltage in accordance with the calculated SOC and SOH. Consequently, the power control device can prevent the life of the storage battery from being reduced. In addition, the power control device can supply stable power to a load by reducing the fluctuation component of the DC link voltage.

More specifically, the determination unit may determine power to be outputted by the storage battery, in such a manner that the charge time or the discharge time is increased as the state of deterioration of the storage battery becomes worse.

In general, deterioration of a storage battery can be reduced by increasing the charge time or discharge time of the storage battery. Therefore, the life of a storage battery can be increased by using the storage battery in a more deteriorated state in such a manner as to reduce the deterioration thereof.

One aspect of the present invention may be a power control device, wherein storage batteries each of which is the storage battery are connected in parallel to the first power supply line and the second power supply line, the acquisition unit acquires a voltage value from each of the storage batteries, the determination unit further calculates a value corresponding to the SOC of each storage battery from the acquired voltage value of the storage battery, the power control device further comprises a power distribution ratio calculation unit that calculates a distribution ratio of power to be outputted by each storage battery, in accordance with a ratio of the value corresponding to the SOC among the storage batteries, and the informing unit calculates the current value for each of the storage batteries based on the power to be outputted by the storage battery and the distribution ratio calculated by the power distribution ratio calculation unit, and informs a storage battery of the calculated current value, the power being determined by the determination unit, and the storage battery corresponding to the calculated current value.

Accordingly, the amount of power charged to a plurality of storage batteries can be kept in a certain range constantly, and consequently, the life spans of the storage batteries can be made uniform. Consequently, the life span of the entire storage device can be prevented from being reduced because of heavy use of some storage batteries.

The determination unit may determine an upper limit of power to be outputted by each of the storage batteries, in accordance with a state of deterioration of a storage battery with a highest temperature among the storage batteries.

According to this, a limit of power to be outputted to each storage battery can be set based on the state of deterioration of a storage battery with the highest temperature. Therefore, heavy use of some storage batteries can be prevented more reliably.

Specifically, a configuration may be made such that the power generation unit is a power generation system using green energy, the load includes an AC load, a DC/DC conversion unit which converts the green energy to DC power is connected between the power generation unit and the capacitor, a DC/AC conversion unit which converts the DC power outputted from the DC/DC conversion unit to AC power is connected between the capacitor and the load, the acquisition unit further acquires power values outputted by the DC/DC conversion unit and the DC/AC conversion unit, the determination unit determines power to be outputted by the storage battery so as to suppress a difference between the power values outputted by the DC/DC conversion unit and the DC/AC conversion unit.

The acquisition unit may acquire the deterioration information containing the voltage value and the temperature value of the storage battery each time the storage battery outputs a current in response to receiving the current value, until a fluctuation of the voltage applied to the capacitor is eliminated, and the determination unit may update a charge amount of the storage battery and a state of deterioration of the storage battery each time the determination unit acquires the deterioration information.

One aspect of the present invention is a power supply system including: a power generation unit; a load to which an electric appliance is connected; a power storage device that accumulates power generated by the power generation unit, and supplies power to the load; and a power control device that performs charge control or discharge control of the power storage device, the power control device and the power storage device being connected to each other via a network, wherein the power control device includes an acquisition unit that acquires voltage information and deterioration information via the network, the voltage information indicating information of a voltage applied to a capacitor provided between the power generation unit and the load via a first power supply line and a second power supply line, the deterioration information indicating a state of deterioration of a storage battery included in the power storage device and connected to the power generation unit via the first power supply line and the second power supply line, a determination unit that compares the voltage information acquired by the acquisition unit with a predetermined reference voltage so as to detect a fluctuation of the voltage applied to the capacitor, and determines power to be outputted by the storage battery so as to suppress the fluctuation of the voltage applied to the capacitor, and an informing unit that informs the storage battery of a current value corresponding to the power to be outputted by the storage battery, wherein the determination unit detects the state of deterioration of the storage battery using the deterioration information acquired by the acquisition unit, and determines power to be outputted by the storage battery by adjusting a charge time or a discharge time of the storage battery in accordance with the state of deterioration of the storage battery, and the power storage device includes: the storage battery; a current controller that controls a current to be charged or discharged to or from the storage battery in response to receiving the current value from the power control device; a detection unit that detects a voltage value and a temperature value of the storage battery so as to transmit the voltage value and the temperature value to the power control device; and a current detection unit that detects a current outputted from the storage battery so as to output the current to the current controller.

One aspect of the power control method according to the present invention includes: acquiring voltage information and deterioration information, the voltage information indicating information of a voltage being applied to a capacitor provided between a power generation unit and a load via a first power supply line and a second power supply line, the deterioration information indicating a state of deterioration of a storage battery connected to the power generation unit via the first power supply line and the second power supply line; comparing the voltage information acquired in the acquiring with a predetermined reference voltage so as to detect a fluctuation of the voltage applied to the capacitor; determining power to be outputted by the storage battery so as to suppress a fluctuation of a voltage applied to the capacitor; and informing the storage battery of a current value corresponding to the power to be outputted by the storage battery, wherein in the determining, the state of deterioration of the storage battery is detected using the deterioration information acquired in the acquiring, and power to be outputted per unit of time by the storage battery is determined by adjusting a charge time or a discharge time of the storage battery in accordance with the state of deterioration of the storage battery.

Hereinafter, the embodiments of the present invention are described in detail with reference to the drawings. Each of the embodiments described hereinafter illustrates a preferable example of the present invention. The numerical values, the components, the arrangement position and topology of the components, the steps, and the order of the steps that are depicted in the following embodiments are examples. Therefore, the present invention is not limited by each of these embodiments. The present invention is limited only by the Claims appended hereto. Consequently, components among the components in the following embodiments, which are not described in the independent claim that defines the most generic concept of the present invention are not necessarily needed in order to achieve an object of the present invention, and are described as components constituting a more preferable embodiment.

Embodiment 1

Hereinafter, a power control device according to Embodiment 1 of the present invention is described with reference to the drawings.

FIG. 1 is a system configuration diagram illustrating a power supply system which includes the power control device according to the present embodiment. A power control device is also referred to as a cooperative ECU. Therefore, the cooperative ECU in the following description corresponds to the power control device in the claims.

In FIG. 1, the power supply system according to the present embodiment includes a power source 101, a power source 106, a capacitor 103, a load 104, a cooperative ECU 105, and a power storage device 107.

The power source 101, the power source 106, the capacitor 103, the load 104, and the power storage device 107 are connected to each other via a positive polarity power line 108 and a negative polarity power line 109. The load 104 is connected to n pieces of appliances (n≥1) 113 (hereinafter, an appliance 113a, an appliance 113b, ..., an appliance 113n are collectively referred to as an appliance 113).

The appliance 113 indicates, for example, an air-conditioner, a refrigerator, a television, or an electric vehicle. The power source 101, the power source 106, and the power storage device 107 then supply power for driving each appliance 113 to the load 104.

The cooperative ECU 105 and the power storage device 107 are connected to each other via networks 110 and 111. The cooperative ECU 105 and a voltage detection unit 102 are connected via a network 112. Here, the network 110, the network 111, and the network 112 are implemented by a wired network such as the Ethernet (registered trademark), a wireless network such as the wireless LAN, a network established by a broadcast wave, or a combination thereof.

The power source 101 and the power source 106 supplies the power generated by a power generation system utilizing renewable energy (or called green energy) such as sunlight or wind power, or the power generated by an electric power company to the load 104 and the power storage device 107. As another example of a power generation supply system utilizing renewable energy, a power generation system which uses energy such as solar heat, geothermal heat, ocean current, wave power, or tidal power in addition to sunlight and wind power may be applied.

The voltage detection unit 102 detects a DC link voltage VDC which is a voltage between the positive polarity power line 108 and the negative polarity power line 109, and outputs the DC link voltage VDC to the cooperative ECU 105. The DC link voltage is in other words the voltage applied to the capacitor 103 described below.

The capacitor 103 is connected in order to smooth the DC link voltage VDC. The voltage outputted when the power storage device 107 outputs a charge or discharge current has a square wave. On the other hand, the voltage applied to the load 104 is preferably constant. For this reason, the square wave output voltage outputted from the power storage device 107 is smoothed by connecting the capacitor 103 so that stable power is supplied to the load 104 as much as possible. In the present embodiment, the load 104 is configured with a DC load.

The cooperative ECU 105 controls the amount of current to be charged or discharged to or from the power storage device 107 (hereinafter referred to as "charge or discharge current") via the above-mentioned network. Specifically, the cooperative ECU 105 detects the state of deterioration of a storage battery by acquiring the voltage, temperature, and the like of the storage battery (not shown) provided in the power storage device 107. The cooperative ECU 105 then informs the power storage device 107 of power PSB to be charged or discharged to or from the power storage device 107, based on the state of deterioration of the storage battery.

The power storage device 107 includes a storage battery (not shown), and has functions of charging the storage battery with the power supplied from the power source 101 or the power source 106, and supplying the load 104 with power. Furthermore, the power storage device 107 detects the voltage and temperature of the storage battery, and outputs the voltage and temperature to the cooperative ECU 105. In addition, the power storage device 107 acquires an amount of current to be charged or discharged to or from itself as a designated current value ISB. The power storage device 107 controls charging and discharging current in accordance with the designated current value ISB.

Figure 2:
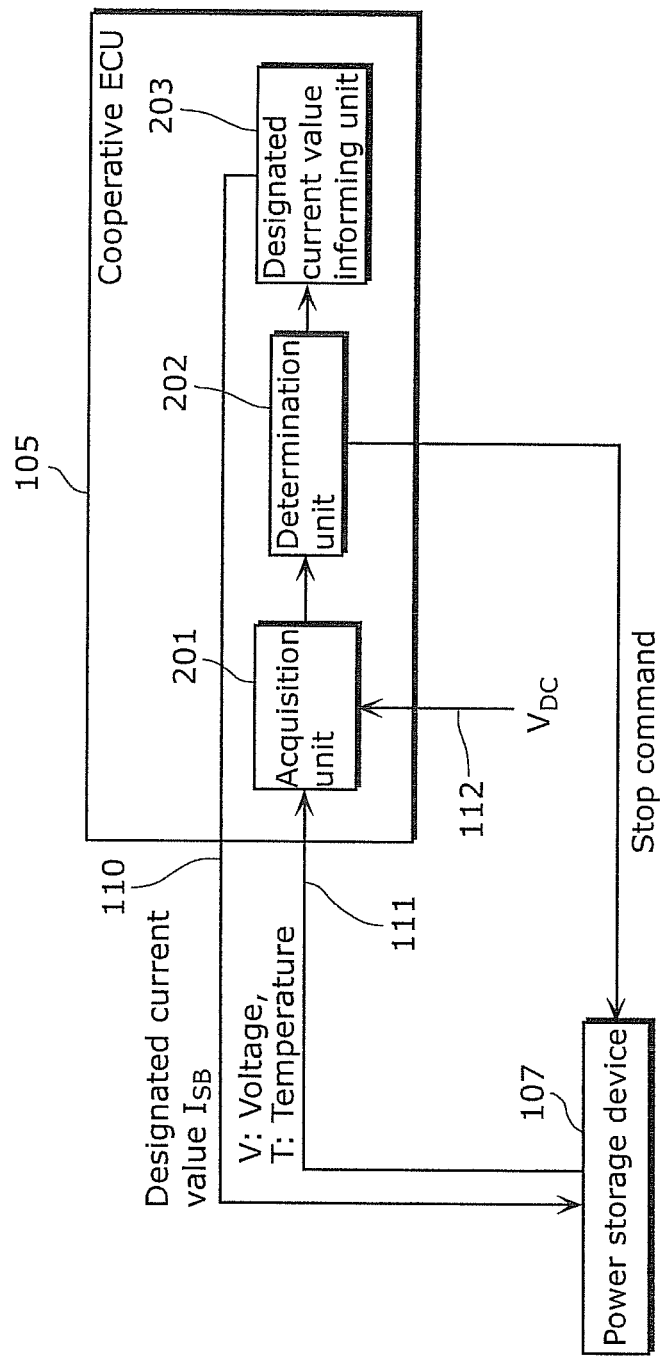
FIG. 2 is a functional block diagram of a cooperative ECU according to Embodiment 1 of the present invention.

FIG. 2 is a functional block diagram of the cooperative ECU 105 according to the present embodiment. In FIG. 2, the cooperative ECU 105 according to the present embodiment includes an acquisition unit 201, a determination unit 202, and a designated value informing unit 203.

The acquisition unit 201 acquires information of the voltage applied to the capacitor 103 and deterioration information which indicates a state of deterioration of a storage battery, the capacitor 103 being provided between a predetermined power generation unit (for example, the power sources 101 and 106) and the load 104 via a first power supply line and a second power supply line, and the storage battery being connected to the predetermined power generation unit via the first power supply line and the second power supply line. More specifically, the acquisition unit 201 acquires a DC link voltage VDC from the voltage detection unit 102 depicted in FIG. 1, and acquires information indicating a state of deterioration of the storage battery from the power storage device 107. Here, an example of the case is described where the voltage and temperature values of the storage battery are acquired as information indicating a state of deterioration of the storage battery.

The determination unit 202 determines the power to be outputted by the storage battery. Specifically, the determination unit 202 compares the voltage information acquired by the acquisition unit 201 with a predetermined reference voltage, and detects a fluctuation component of the voltage applied to the capacitor 103. Subsequently, the determination unit 202 determines the power to be outputted by the storage battery so that the fluctuation component of the voltage applied to the capacitor 103 is suppressed.

Specifically, the determination unit 202 calculates a fluctuation energy $\Delta W$ which corresponds to the fluctuation component of the acquired DC link voltage VDC. The determination unit 202 then determines the power PSB to be charged or discharged to or from the power storage device 107, and an output time TSB, based on the state of the storage battery so as to suppress the fluctuation energy $\Delta W$.

Here, deterioration information is, for example, a value which is calculated as a value corresponding to at least one of the voltage and temperature values of the storage battery. Then the determination unit 202 calculates SOC indicating the charge state of the storage battery and SOH indicating the state of deterioration of the storage battery, based on the acquired voltage and temperature values of the storage battery.

Two types of calculation methods are known for the calculation of SOC which indicates the power storage state of a storage battery: a method taking deterioration of the battery into consideration, and a method not taking deterioration of the battery into consideration. The SOC can be recognized with a certain degree of accuracy using either calculation method. On the other hand, because a SOH cannot be measured directly, there are known a method for estimating the state of deterioration based on an internal resistance of the storage battery, and a method for estimating the state of deterioration based on the voltage and temperature of the storage battery. In the present embodiment, an example of the case is described where SOH is estimated based on the voltage and temperature values of the storage battery in relation to the charge or discharge current. The details are described below.

The designated value informing unit 203 informs the storage battery of a designated current value which corresponds to the power to be outputted by the storage battery. Specifically, the designated value informing unit 203 determines a designated current value ISB which corresponds to the power to be charged or discharged to or from the power storage device 107 based on the voltage value acquired by the acquisition unit 201, the SOC determined by the determination unit 202, and the power PSB. The designated value informing unit 203 then transmits the determined designated current value ISB to the power storage device 107 via the network 110.

Hereinafter, the phrase "charge or discharge power to be outputted by the power storage device 107" is used as needed, and when the storage battery of the power storage device 107 is discharged so as to supply power, the phrase means that positive power is outputted, and when the storage battery of the power storage device 107 is charged by supplying the current, the phrase means that negative power is outputted.

Figure 3:
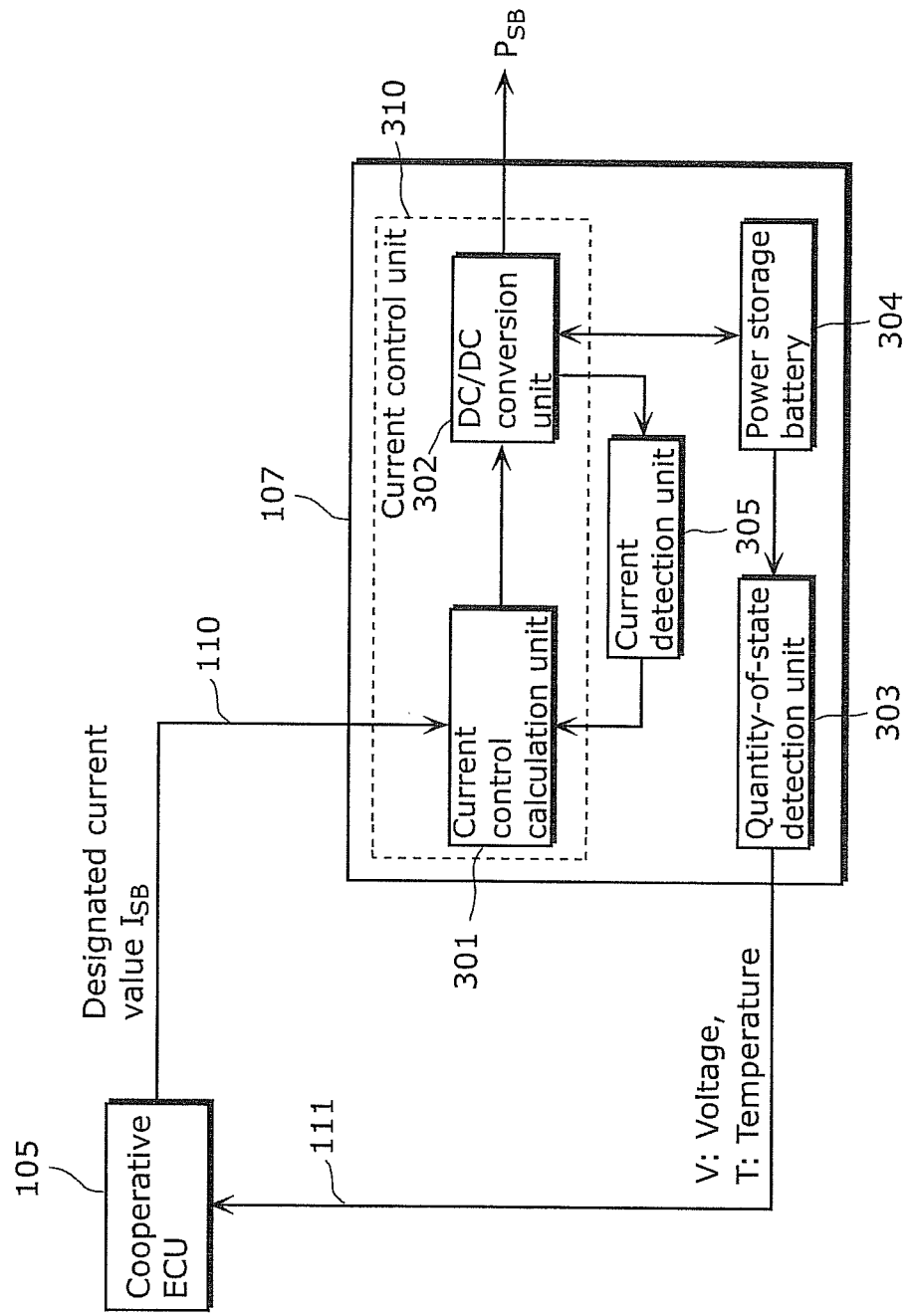
FIG. 3 is a functional block diagram of a power storage device according to Embodiment 1 of the present invention.
Figure 4:
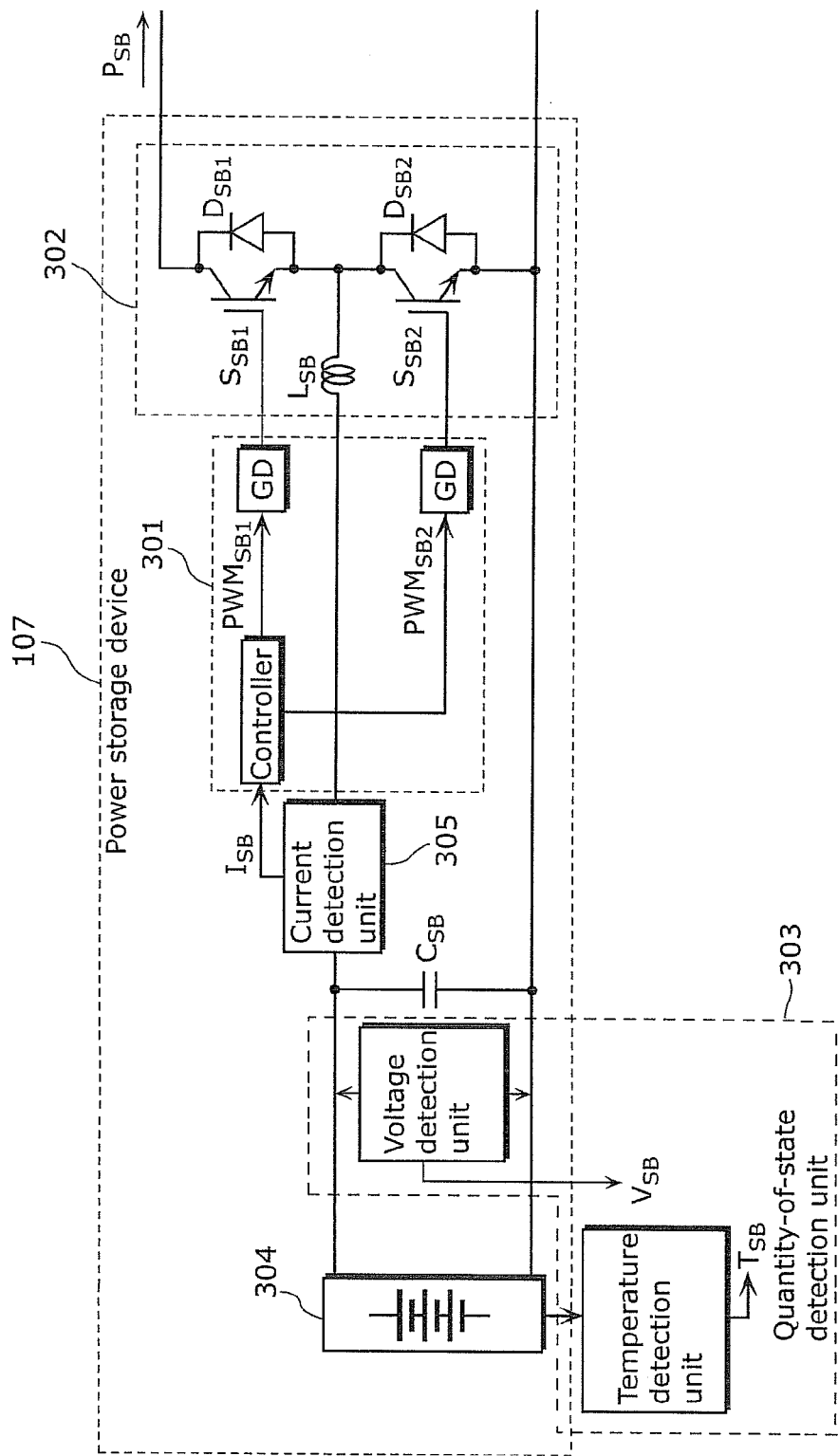
FIG. 4 is a diagram illustrating an exemplary circuit configuration of the power storage device according to Embodiment 1 of the present invention.

FIG. 3 is a functional block diagram of the power storage device 107 according to the present embodiment. FIG. 4 is a diagram illustrating an exemplary circuit configuration of the power storage device 107 according to the present embodiment. As illustrated in FIGS. 3 and 4, the power storage device 107 according to the present embodiment includes a current control unit 310, a quantity-of-state detection unit 303, a storage battery 304, and a current detection unit 305.

In response to receiving a designated current value ISB from the cooperative ECU 105, the current control unit 310 controls the current for charging or discharging the storage battery 304.

More particularly, the current control unit 310 has a current control calculation unit 301 and a DC/DC conversion unit 302. The current control calculation unit 301 controls the current for charging or discharging the storage battery 304. Specifically, the current control calculation unit 301 performs feedback control based on the designated current value ISB transmitted from the cooperative ECU 105 via the network 110. In addition, the current control calculation unit 301 detects the amount of current to be charged or discharged to or from the storage battery 304 using the current detection unit 305. Subsequently, the current control calculation unit 301 repeats the feedback control until the amount of current to be charged or discharged to or from the storage battery 304 is matched with the designated current value ISB.

As illustrated in FIG. 4, the current control operation part 301 generates a modulation wave in the PWM (Pulse Width Modulation) system in accordance with the designated current value ISB, and generates a switching pulse signal for driving the DC/DC conversion unit 302.

The DC/DC conversion unit 302 receives the switching pulse signal generated by the current control calculation unit 301, and outputs the current to be charged or discharged to or from the storage battery 304, in accordance with the switching pulse signal. As illustrated in FIG. 4, a common two-way step up or down DC/DC converter is used in the circuit configuration of the DC/DC conversion unit 302.

The quantity-of-state detection unit 303 detects the voltage and temperature of the storage battery 304. In addition, the quantity-of-state detection unit 303 transmits the detected voltage and temperature of the storage battery 304 to the cooperation control ECU 105 via the network 111. As illustrated in FIG. 4, the quantity-of-state detection unit 303 includes a voltage detection unit for detecting the voltage of the storage battery 304, and a temperature detection unit for detecting the temperature of the storage battery 304. The voltage detection unit includes a common voltage sensor. The temperature detection unit includes a common temperature sensor.

The storage battery 304 accumulates electrical energy while outputting the electrical energy as needed. The storage battery 304 is, for example, a lithium-ion battery, a lead storage battery, a Nas battery, or a nickel hydride battery. The storage battery 304 is not limited to these examples, and may be substituted by a member which has the function of a storage battery.

The current detection unit 305 detects the amount of the charge and discharge current which is outputted from the storage battery 304 via the DC/DC conversion unit 302. Subsequently, the detected amount of current is outputted to the current control calculation unit 301.

Next, the operation of the cooperative ECU 105 configured in the above-described manner as the power control device according to the present embodiment is described with reference to the drawings.

Figure 5:
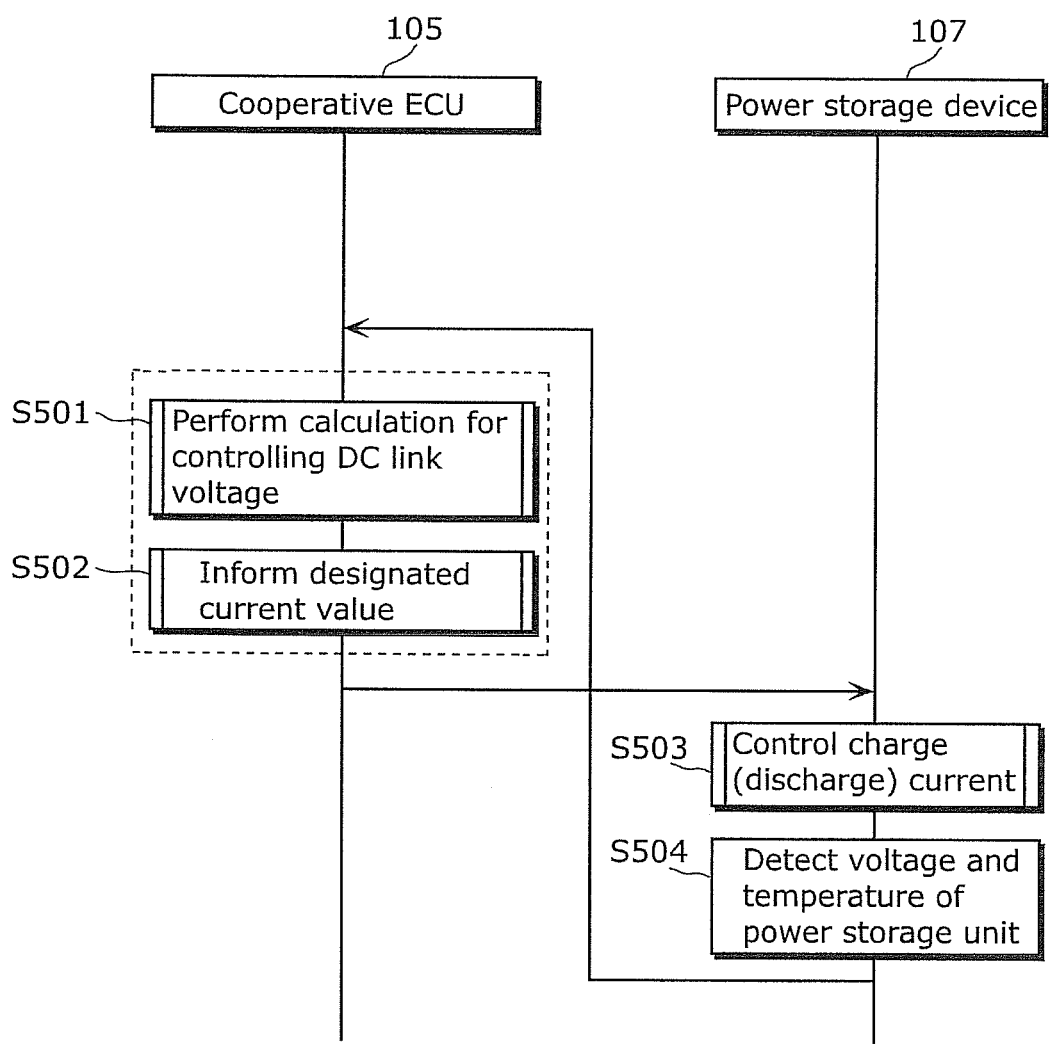
FIG. 5 is a sequence diagram illustrating the operation of a cooperative ECU and a power storage device in the power supply system according to Embodiment 1 of the present invention.

FIG. 5 is a sequence diagram illustrating the operation of the cooperative ECU 105 and the power storage device 107 in the power supply system according to the present embodiment.

First, the cooperative ECU 105 calculates the fluctuation component of the DC link voltage VDC by the determination unit 202. Furthermore, the determination unit 202 determines the fluctuation energy ΔW which corresponds to the fluctuation voltage component. In addition, the determination unit 202 determines SOC and SOH from the voltage and temperature of the storage battery 304 that have been transmitted by the quantity-of-state detection unit 303 of the power storage device 107. The determination unit 202 then calculates the power PSB to be charged or discharged to or from the power storage device 107, and the output time TSB, in accordance with the determined fluctuation energy ΔW, SOC, and SOH (S501).

Next, the cooperative ECU 105 determines a designated current value ISB by the designated value informing unit 203, the designated current value ISB corresponding to the power PSB determined in step S501. Subsequently, the designated value informing unit 203 transmits the designated current value ISB to the power storage device 107 (S502).

Next, the power storage device 107 controls the current of the storage battery 304 by the current control calculation unit 301 based on the designated current value ISB transmitted from the cooperative ECU 105. Consequently, the power storage device 107 outputs a charge or discharge current for suppressing the fluctuation component of the DC link voltage (S503).

Next, the power storage device 107 detects the voltage and temperature of the storage battery 304 by the quantity-of-state detection unit 303, the voltage and temperature varying every moment in accordance with the output of the charge and discharge current of the storage battery 304. The quantity-of-state detection unit 303 then transmits information regarding the detected voltage and temperature to the cooperative ECU 105 (S504).

Figure 6:
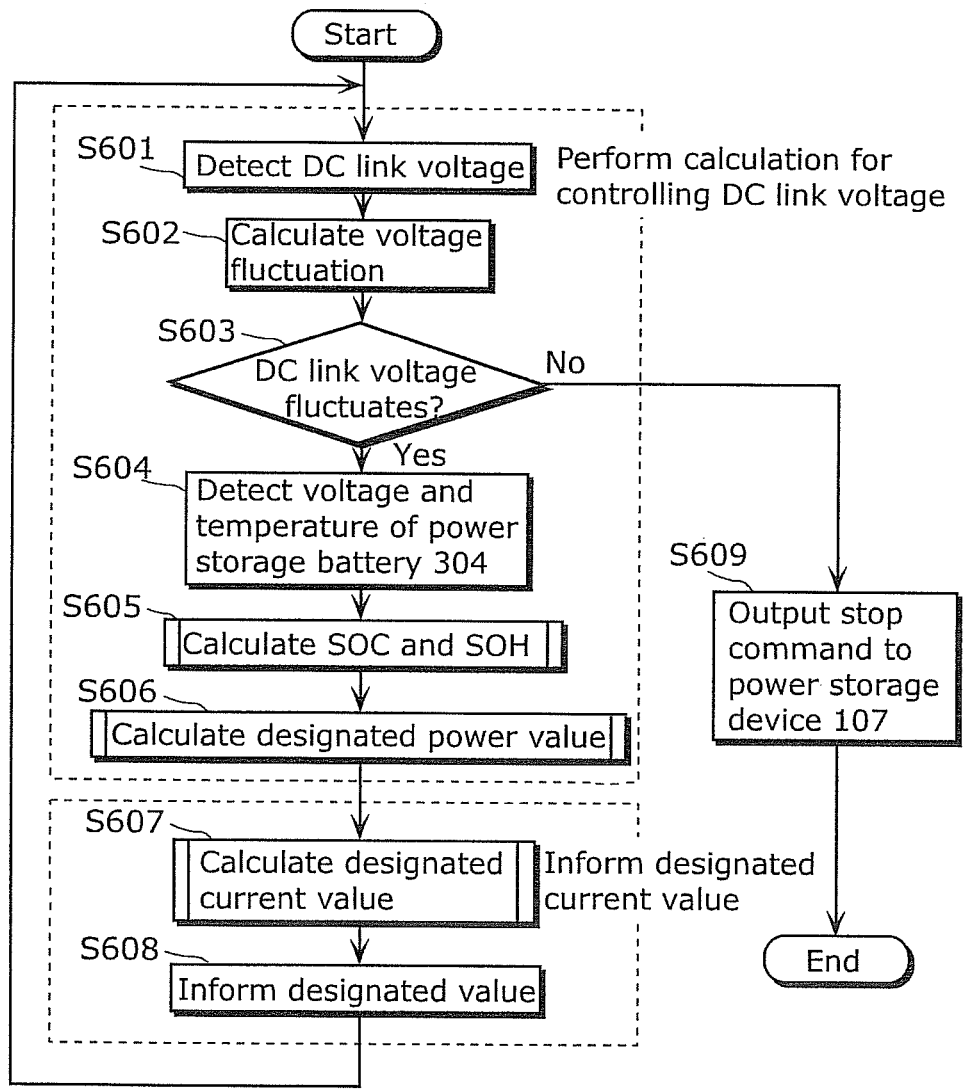
FIG. 6 is a flowchart illustrating the flow of the process performed by the cooperative ECU according to Embodiment 1 of the present invention.

FIG. 6 is a flowchart illustrating the flow of DC link voltage control calculation process (step S501 in FIG. 5) and informing process of designated current value (step S502 in FIG. 5) that are performed by the cooperative ECU 105. The cooperative ECU 105 acquires the DC link voltage VDC, and the voltage and temperature values of the storage battery 304. The cooperative ECU 105 determines the power to be charged or discharged to or from the power storage device 107 based on the acquired voltage and temperature values in order to suppress the fluctuation component of the DC link voltage VDC. Steps S601 to S606 in FIG. 6 correspond to step S501 in FIG. 5. Steps S607 to S608 correspond to step S502 in FIG. 5.

First, the cooperative ECU 105 detects the DC link voltage VDC by the acquisition unit 201 (S601). The cooperative ECU 105 then calculates, by the determination unit 202, a fluctuation component ΔV of the detected DC link voltage with respect to the reference value of the DC link voltage, which should be maintained at a constant level (S602). The reference value of the DC link voltage is, for example, previously set in the cooperative ECU 105.

Next, the cooperative ECU 105 determines by the determination unit 202 whether or not the detected DC link voltage VDC has a fluctuation component (S603).

In the case where the cooperative ECU 105 determines in step S603 that there is no fluctuation component in the DC link voltage VDC (No in S603), the determination unit 202 transmits a stop command for current control to the power storage device 107, and terminates the present process (S609). In other words, in the case where it is determined by the current outputted from the power storage device 107 in response to receiving the designated current value ISB that the suppression of the fluctuation component of the DC link voltage VDC is completed, the cooperative ECU 105 terminates the present process.

On the other hand, in the case where the cooperative ECU 105 determines in step S603 that the DC link voltage VDC has a fluctuation component (Yes in S603), the cooperative ECU 105 acquires the voltage and temperature values of the storage battery 304 from the acquisition unit 201, which are transmitted from the power storage device 107 (S604). The cooperative ECU 105 then calculates, by the determination unit 202, the fluctuation energy ΔW corresponding to the fluctuation component of the DC link voltage VDC of the capacitor 103. In addition, SOC and SOH of the storage battery 304 are determined from the obtained voltage and temperature (S605). How to determine SOC and SOH is described below.

Next, the determination unit 202 calculates the power PSB to be charged or discharged to or from the power storage device 107, and the output time TSB, in accordance with the temperature and SOH of the storage battery 304 in order to suppress the fluctuation energy ΔW (S606). How to determine the power PSB and the output time TSB is described below.

Next, the cooperative ECU 105 determines the designated current value ISB corresponding to the power PSB to be charged or discharged to or from the power storage device 107 by using the SOC determined in step S605 and the power PSB determined in step S606 by the designated value informing unit 203, and the voltage of the storage battery 304 acquired in step S604 (S607). The details of step S607 is described in FIG. 10.

Next, the designated value informing unit 203 informs the power storage device 107 of the determined designated current value ISB (S608).

Subsequent to step S608, the power storage device 107, which has received the designated current value ISB, outputs a charge or discharge current based on the designated current value ISB. The voltage and temperature of the storage battery 304 vary every moment in accordance with the output. Thus, in the present aspect of the invention, the cooperative ECU 105 is assumed to continue to acquire the voltage and temperature of the storage battery 304 by looping from step S608 to step S601 illustrated in FIG. 6 until a fluctuation component of the DC link voltage is eliminated.

Accordingly, the cooperative ECU 105 continues to acquire the voltage and temperature of the storage battery 304 until a fluctuation component of the DC link voltage is eliminated even when the voltage and temperature of the storage battery 304 vary every moment in accordance with the charge or discharge current outputted by the power storage device 107. Therefore, the cooperative ECU 105 can recognize the remaining capacity and state of deterioration of the storage battery 304 in real time. Consequently, the cooperative ECU 105 can control the remaining capacity and state of deterioration of the storage battery 304 with high accuracy.

That is to say, the acquisition unit 201 may continue to acquire deterioration information containing the voltage and temperature values of the storage battery for each time the storage battery outputs a current in response to receiving a designated current value, until a fluctuation component of the voltage applied to the capacitor 103 is eliminated. Then, the determination unit 202 updates the charge amount and state of deterioration of the storage battery for each time deterioration information is acquired.

As a method to determine whether or not the detected DC link voltage VDC has a fluctuation component, the determination unit 202 may determine that the detected DC link voltage VDC has no fluctuation component in the case where the fluctuation component falls below a predetermined threshold value. A threshold value may be defined, for example, as 1% or 5% value of the nominal voltage of the storage battery 304. A threshold value may be defined by other method such as to use a fixed value stored in a ROM (Read Only Memory) or the like as the threshold value.

Next, how the SOC and SOH are determined in step S605 by the determination unit 202 is described with reference to FIG. 7.

Figure 7:
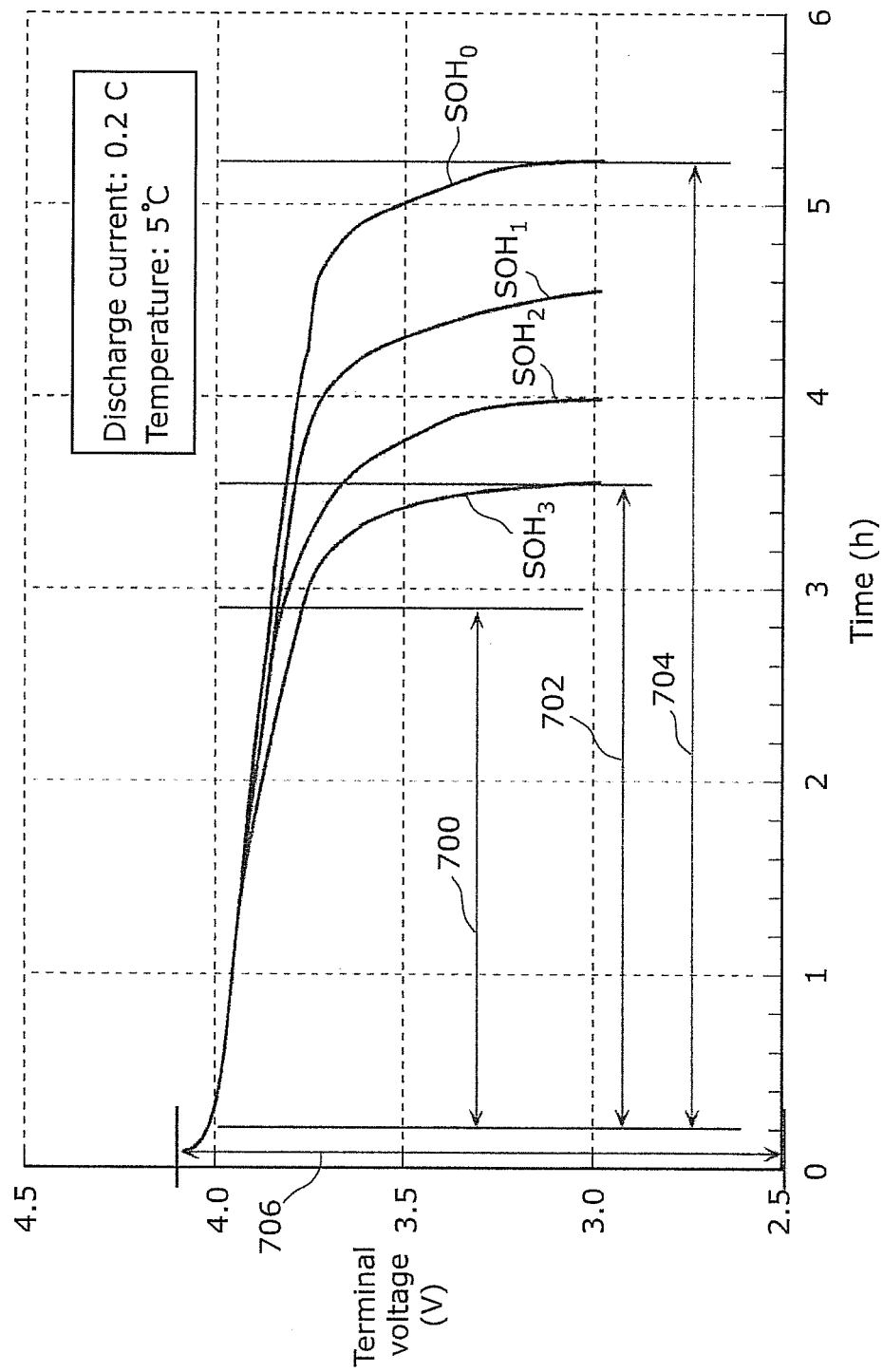
FIG. 7 is a graph illustrating an exemplary relationship between the terminal voltage of a storage battery and elapsed time.

FIG. 7 is a graph illustrating an exemplary relationship (hereinafter referred to as a voltage characteristic) between the terminal voltage (V) of the storage battery 304 and elapsed time (h) under the condition that the discharge current is 0.2 C and the temperature is 5 degree.

A curve SOH0 indicates the voltage characteristic of the storage battery 304 with the lowest state of deterioration (i.e., a brand new storage battery).

In the order of a curve SOH1, a curve SOH2, and a curve SOH3, the respective curves indicate voltage characteristics of the storage battery 304 with increasing deterioration (aged deterioration due to long time use, and repetition of charge and discharge).

As illustrated in FIG. 7, when the storage battery 304 starts with a full charge, the terminal voltage decreases substantially linearly as the discharge time elapses. However, the terminal voltage suddenly drops after a certain time. Furthermore, the time period during which the terminal voltage decreases linearly is shortened as the deterioration of the storage battery 304 proceeds in FIG. 7. Consequently, the discharge time until the terminal voltage initially in a full charge state falls below a certain voltage level is shortened as the deterioration of the storage battery 304 proceeds.

For example, when the elapsed times until the terminal voltage becomes 3V or less are compared, a brand-new storage battery 304 needs about 5.2 hours of elapsed time from a full charge as illustrated by the curve SOH0. On the other hand, the storage battery 304 with more deterioration has a terminal voltage of 3V or less after an elapse of about 3.6 hours from a full charge as illustrated by the curve SOH3.

The factors that determine the voltage characteristic illustrated by the curves SOH0 to SOH3 include the discharge current (i.e., the current used), and the temperature. Therefore, once the discharge current and the temperature are determined, a curve indicating the voltage characteristic corresponding to the state of deterioration of the storage battery 304 can be uniquely obtained by an experiment.

The determination unit 202 according to the present embodiment determines the SOH by using a curve which indicates the above-mentioned voltage characteristic.

Specifically, first, under typical conditions of a plurality of discharge currents and temperatures, a voltage characteristic is measured for each state of deterioration of the storage battery 304 by an experiment so that data regarding curves each indicating a voltage characteristic is obtained in advance.

As a method for acquiring such data, data may be acquired by changing some conditions of the discharge current and temperature conditions in a range of an assumed operating environment of the storage battery 304. For example, when the operating temperature range is 5 to 80° C. and the operating current range is 0 to 0.8° C., 4 levels of temperature ranges starting from 5 degrees in increment of 25 degrees, and 5 levels of discharge current ranges starting from 0 in increment of 0.2 C can be set so that data is obtained in total 20 patterns. Regarding the state of deterioration of the storage battery 304, voltage characteristics may be measured using a plurality of storage batteries with different state of deteriorations.

Next, by using the voltage characteristic data obtained in this manner, the determination unit 202 calculates a discharge time as a relative rate which is taken until the terminal voltage decreases to a certain voltage (for example, 3V) or less starting from a full charge state assuming that a brand-new state corresponds to a rate of 100. In the present embodiment, the relative rate is used as the SOH.

For example, in FIG. 7, the SOH0 in a brand-new state needs an elapsed time 704 until the terminal voltage decreases to 3 V or less. Because this time length is used as a reference, the SOH of the SOH0 is 100. The SOH3 needs an elapsed time 702 until the terminal voltage decreases to 3 V or less. Here, because the time length of the elapsed time 702 is 69 when the elapsed time 704 is assumed to be 100, the SOH of the SOH3 is calculated as 69.

On the other hand, SOC is determined as a relative value to the reference terminal voltage in a full charge state.

Specifically, referring to FIG. 7, the terminal voltage 706 with the discharge time of 0 is defined as the reference value (for example, 100). Here, in the case where the present value of terminal voltage is 3.5V, the determination unit 202 determines SOC as $(3.5/4.2) \times 100 = 83$.

In this manner, the determination unit 202 can calculate the SOH and SOC.

More specifically, the numerical values corresponding to the above-mentioned curves of the voltage characteristic for the power storage device 107 according to the present embodiment may be recorded in a ROM (Read Only Memory) or the like, for example, as data in a table format, the voltage characteristic being obtained by an experiment in advance. According to this, the determination unit 202 can calculate the SOH and SOC using the numerical values acquired from the ROM.

Figure 8:
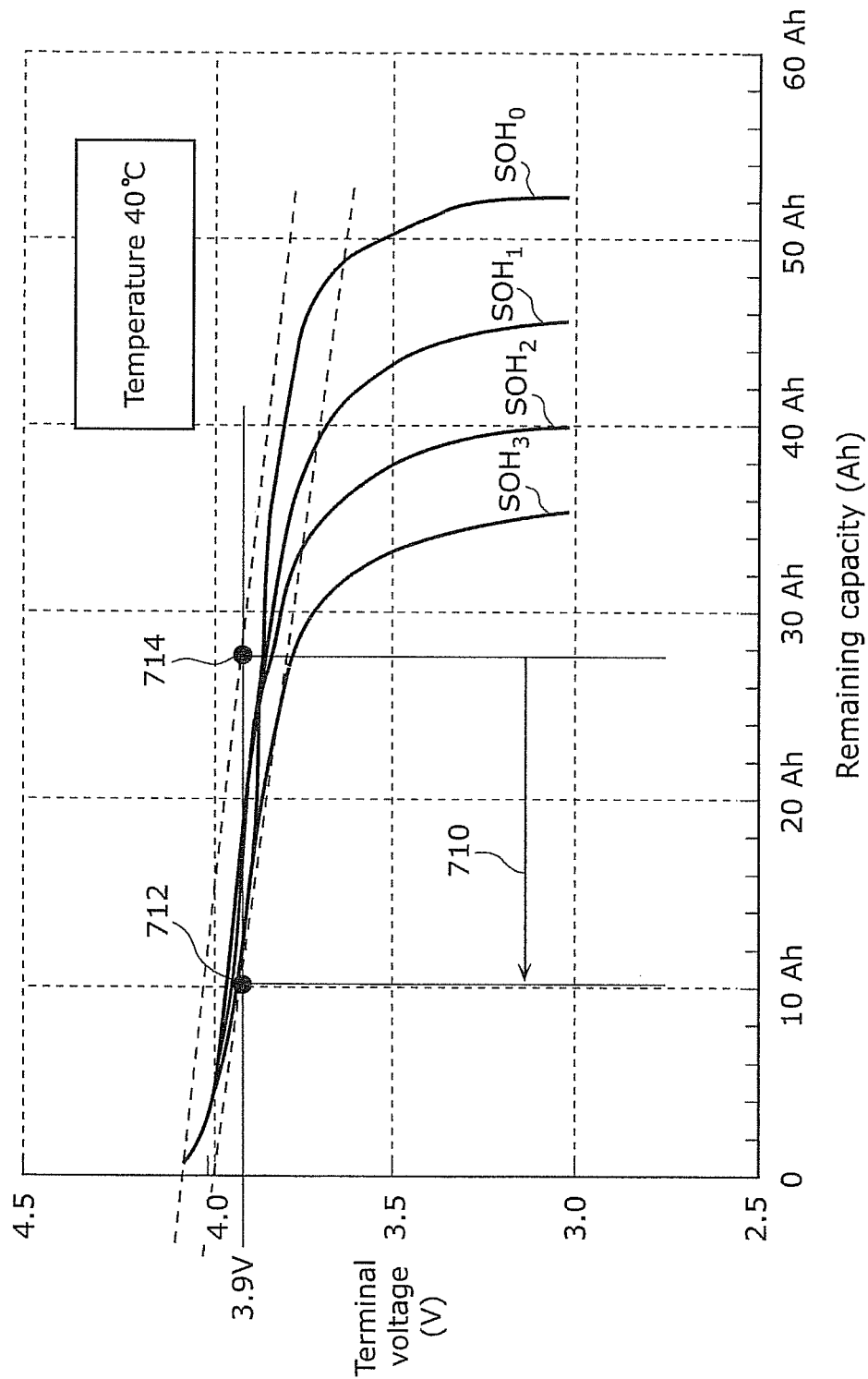
FIG. 8 is a view illustrating an exemplary relationship between the terminal voltage and the storage capacity of a storage battery.

In addition to that the voltage characteristic is measured and recorded as a relationship between the discharge time (h) and the terminal voltage (V) of the storage battery as illustrated in FIG. 7, the voltage characteristic may be measured and recorded as a relationship between the remaining capacity (Ah) and the terminal voltage (V) of the storage battery as illustrated in FIG. 8. By referring to FIG. 8, the cooperative ECU 105 can determine the remaining capacity from the temperature and voltage.

Next, an exemplary method for determining, by the determination unit 202 in step S606, the power to be charged or discharged to or from the power storage device 107 is described with reference to FIG. 9.

Figure 9:
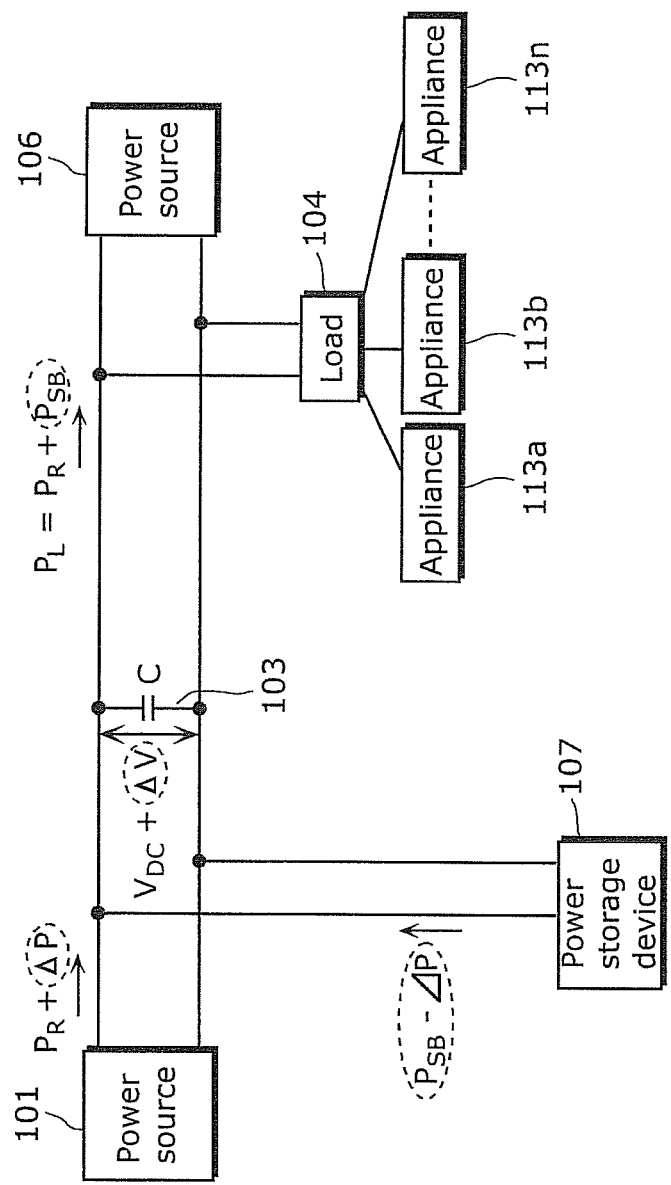
FIG. 9 is a diagram for explaining a method for compensating a fluctuation of DC link voltage in the cooperative ECU according to Embodiment 1 of the present invention.

FIG. 9 is a diagram for explaining a method for compensating a fluctuation of DC link voltage in the cooperative ECU 105 according to an embodiment of the present invention.

As described in the above, a fluctuation component ΔV occurs in the DC link voltage VDC because of, for example, an effect of a fluctuation power component ΔP generated by the power source 101. Thus, in order to suppress the fluctuation power component ΔP, power "−ΔP" with the reversed polarity of the fluctuation power component ΔP is outputted from the power storage device 107.

The determination unit 202 detects the fluctuation voltage ΔV of the DC link voltage in step S602 in FIG. 6. Subsequently, the fluctuation energy ΔW of the capacitor 103 is determined in accordance with Expression (1). Where C in Expression (1) is the capacitance of the capacitor 103.

[Expression 1]

$$\Delta W = \frac{C(\Delta V)^2}{2} \quad (1)$$

The fluctuation energy ΔW is converted to the output power ΔPSB and the output time TSB based on the below-stated Expression (2).

[Expression 2]

$$\Delta P = \frac{\Delta W}{T} \quad (2)$$

In this case, first, the output time TSB is determined in accordance with the temperature of the storage battery 304, i.e., the SOH of the storage battery 304, and subsequently, the power PSB is determined as ΔPSB.

Specifically, for example, in the case where W=10 (J), the power PSB to be outputted is determined as 5 (W) assuming that the output time TSB is 2 sec. On the other hand, the power PSB to be outputted is determined as 2 (W) assuming that the output time TSB is 5 sec. Then, whether the output time TSB is determined as 2 sec. or determined as 5 sec. is determined in accordance with the detected temperature and SOH of the storage battery 304.

In general, the temperature of the storage battery 304 rises as the output power is increased even with the same power being outputted. When the same power is outputted, the power PSB to be outputted with the power output time TSB of 5 sec. is higher than the power PSB with the power output time TSB of 2 sec. Therefore, the temperature of the storage battery 304 rises as the output time is shortened. Here, in general, an operable temperature range for a storage battery is defined. Therefore, in the case where the temperature of a storage battery exceeds the operable temperature, the storage battery cannot be used. Accordingly, for example, in the case where the present temperature of the storage battery 304 is more than or equal to a predetermined temperature, the output time TSB may be set to a relatively long time of 5 sec. so as to prevent the storage battery 304 from being inoperable due to a further increase of the temperature. In this case, the power PSB to be outputted is determined as 2 (W).

More generally, a relationship between output power value and temperature may be determined by an experiment in advance. Furthermore, a relationship between output power value and temperature may be recorded in a ROM as discrete data in a table format, the ROM being provided in the power storage device 107 or the cooperative ECU 105. Alternatively, an upper limit of the temperature of the storage battery 304 may be predetermined. The output time TSB may be determined based on the experimental data recorded in the above-mentioned ROM so as to reduce the output time TSB as much as possible in a range not exceeding the upper limit of temperature.

As illustrated in FIG. 8, the remaining capacity of the storage battery 304 when the same terminal voltage is outputted tends to deteriorate rapidly as the storage battery 304 deteriorates, i.e., as the SOH reduces. For example, when power is outputted with the terminal voltage of 3.5V, the remaining capacity of a storage battery A whose characteristic voltage curve is indicated by SOH0 is 50 Ah. However, the remaining capacity of a storage battery B whose characteristic voltage curve is indicated by SOH3 is 35 Ah. Therefore, when 50 Ah is outputted by the storage battery A, a continuous output for 1 hour is possible. However, when 50 Ah is outputted by the storage battery B, the remaining capacity will be zero in about 40 min. In general, once the remaining capacity of a storage battery becomes zero, deterioration of the storage battery proceeds faster than usual, thus creating an undesirable situation. In addition, as described above, a temperature rise due to a large current output is also a deterioration factor of a storage battery.

Therefore, it is preferable for the cooperative ECU 105 to control the amount of power to be outputted by a storage battery in such a manner that the amount of output current by a storage battery with less SOH (more deterioration) is made smaller than the amount of output current by a storage battery with more SOH (less deterioration). Specifically, it is preferable for the determination unit 202 to determine a power to be outputted by a storage battery in such a manner that a storage battery in a more deteriorated state is given a longer charge time or discharge time.

In the present embodiment, the amount of current to be outputted by the storage battery 304 can be arbitrarily adjusted in accordance with the state of the storage battery 304, which is indicated by the temperature, SOH, or the like.

Figure 10:
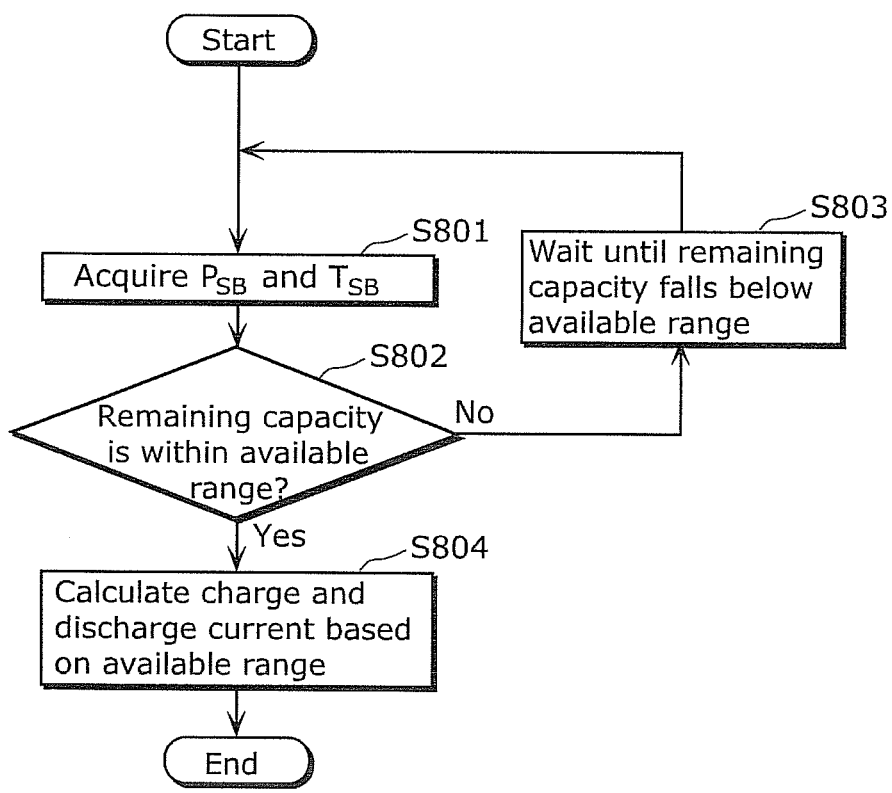
FIG. 10 is a flowchart illustrating the detailed flow of the process performed in step S607 in FIG. 6 in the cooperative ECU according to Embodiment 1 of the present invention.

FIG. 10 is a flowchart illustrating the detailed flow of the process performed by the cooperative ECU 105 in step S607 illustrated in FIG. 6. Here, the designated value informing unit 203 determines a designated current value ISB to be charged or discharged to or from the storage battery 304 by taking the life of the storage battery 304 into consideration.

First, the designated value informing unit 203 acquires power PSB and the output time TSB of the power (S801). The designated value informing unit 203 then determines whether or not the remaining capacity of the storage battery 304 is in an available range based on the SOC determined in step S605 in FIG. 6 (S802). Specifically, in the case where the remaining capacity is contained the region where SOC decreases linearly, it is determined that the remaining capacity of the storage battery 304 can be used. Other than the case, it is determined that the remaining capacity cannot be used. This is because for the purpose of stabilizing supply of voltage from the storage battery 304.

The region where SOC decreases linearly is, for example, the region indicated between a remaining capacity 712 and a remaining capacity 714 with reference to FIG. 8. The voltage characteristic in the region decreases approximately linearly. That is to say, change in the terminal voltage of the storage battery 304 is stable.

In the case where it is determined in step S802 that the remaining capacity is not in the available range, the designated value informing unit 203 waits until the storage battery 304 is charged or discharged so that the SOC falls within the available range (S803). On the other hand, in the case where it is determined in step S802 that the remaining capacity is in the available range, the designated value informing unit 203 determines a designated current value ISB based on the power PSB acquired in step S801, and the voltage of the storage battery 304 acquired in step S604 in FIG. 6 (S804). Specifically, the ISB can be calculated by dividing the PSB by the voltage of the storage battery 304.

In the above, the operation of the cooperative ECU 105 has been described with reference to FIGS. 6 to 10. According to the present aspect, the cooperative ECU 105 detects a DC link voltage and a fluctuation component thereof. In addition, the cooperative ECU 105 acquires the voltage or temperature of the storage battery 304 to calculate the SOC and SOH of the storage battery 304. The cooperative ECU 105 then causes the power storage device 107 to output a current for suppressing the above-described fluctuation component of the DC link voltage, in accordance with the SOC and SOH of the storage battery 304. Accordingly, the cooperative ECU 105 can arbitrarily determine the amount of current to be outputted by the power storage device 107 in accordance with the quantity-of-state of the storage battery 304. Therefore, the cooperative ECU 105 can prevent the life of the storage battery 304 from being reduced. The cooperative ECU 105 can suppress the fluctuation component of the DC link voltage. Therefore, stable power can be supplied to the load 104.

Figure 11:
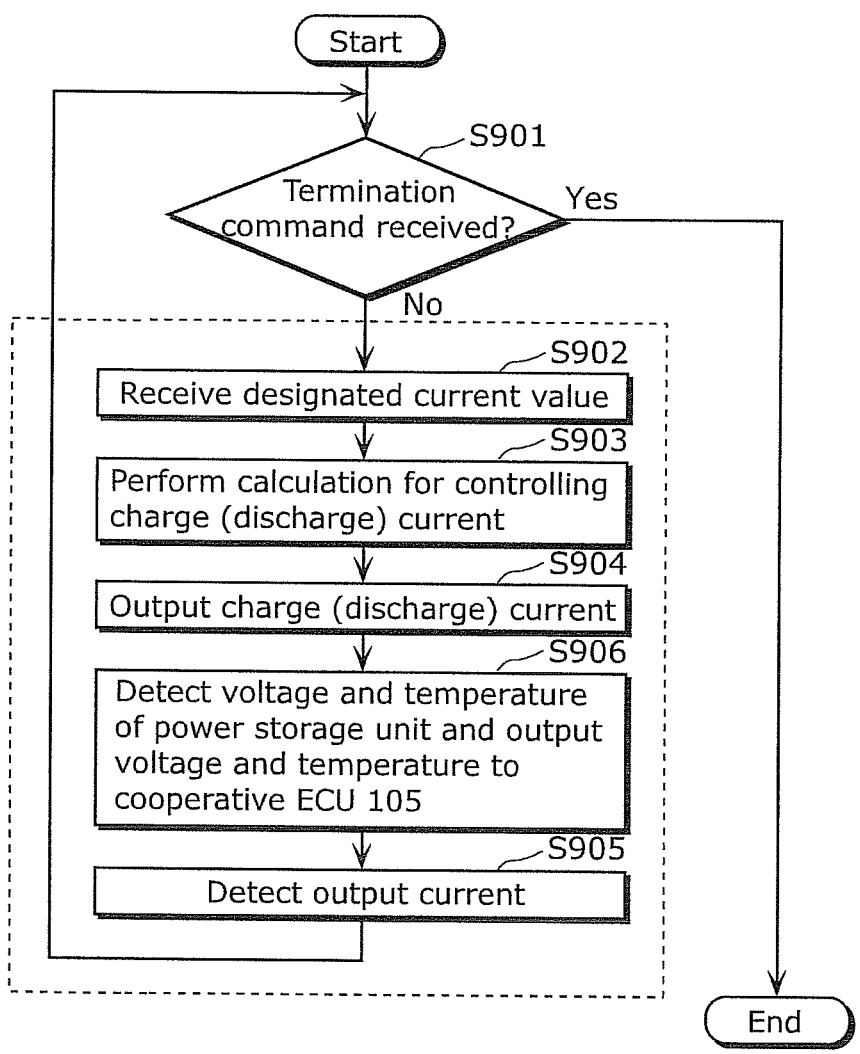
FIG. 11 is a flowchart illustrating the operation of the power storage device according to Embodiment 1 of the present invention.

FIG. 11 is a flowchart illustrating the operation of the power storage device 107. Steps S901 to S905 illustrated in FIG. 11 correspond to step S503 in FIG. 5. Step S906 illustrated in FIG. 11 corresponds to step S504 in FIG. 5.

First, the power storage device 107 determines whether or not a stop command for current control has been received from the cooperative ECU 105 (S901). When the stop command has been received (Yes in S901), the power storage device 107 terminates the present process. On the other hand, when the stop command has not been received (No in S901), the power storage device 107 performs the process in steps S902 to S905.

The power storage device 107 receives a designated current value ISB by the current control calculation unit 301 (S902). The current control calculation unit 301 then adjusts the PWM modulation wave of the DC/DC conversion unit 302 so that the current value outputted from the storage battery 304 and the received designated current value ISB are matched. The current control calculation unit 301 then generates a switching pulse signal based on the determined PWM modulation wave, and transmits the switching pulse signal to the DC/DC conversion unit 302 (S903).

Next, upon receiving the switching pulse signal, the DC/DC conversion unit 302 outputs a charge or discharge current of the storage battery 304 based on the switching pulse signal (S904). Subsequently, the power storage device 107 detects the charge or discharge current by the current detection unit 305, the charge or discharge current being outputted from the storage battery 304. The detected value is further outputted to the current control calculation unit 301 (S905).

Subsequent to step S904, the power storage device 107 detects the voltage and temperature of the storage battery 304 by the quantity-of-state detection unit 303. Subsequently, the detected voltage and temperature are outputted to the cooperative ECU 105 (S906).

The voltage and temperature of the storage battery 304 vary every moment by the charge or discharge current outputted from the storage battery 304. Accordingly, the power storage device 107 detects the voltage and temperature of the storage battery 304 for each time the storage battery 304 outputs a charge or discharge current, and transmits the voltage and temperature to the cooperative ECU 105. In this manner, the cooperative ECU 105 can recognize the remaining capacity and the state of deterioration of the storage battery 304 in real time. Consequently, the cooperative ECU 105 can control the remaining capacity and the state of deterioration of the storage battery 304 with higher precision.

As described above, subsequent to step S905, the power storage device 107 repeats the process of steps S903 to S905 until a stop command for current control is received from the cooperative ECU 105 in step S901.

Embodiment 2

In the cooperative ECU 105 according to Embodiment 1 controls charging and discharging performed by a single power storage device 107. On the other hand, the cooperative ECU according to Embodiment 2 controls charging and discharging performed by a plurality of power storage devices on the storage batteries provided in each power storage device. In this case, a variation in the capacitors of the storage batteries occurs when the remaining capacity of each storage battery is independently controlled. Consequently, a variation in the life spans of the storage batteries occurs. In addition, the life of the entire power storage devices is reduced.

Thus, when the fluctuation component of the DC link voltage VDC is compensated, the cooperative ECU according to Embodiment 2 controls charging and discharge of each power storage device so as to make the remaining capacities of the storage batteries uniform. Accordingly, stable power can be supplied to the load 104 while a reduction in the life spans of the power storage devices can be reduced.

Hereinafter, the cooperative ECU according to Embodiment 2 of the present invention is described in detail.

Figure 12:
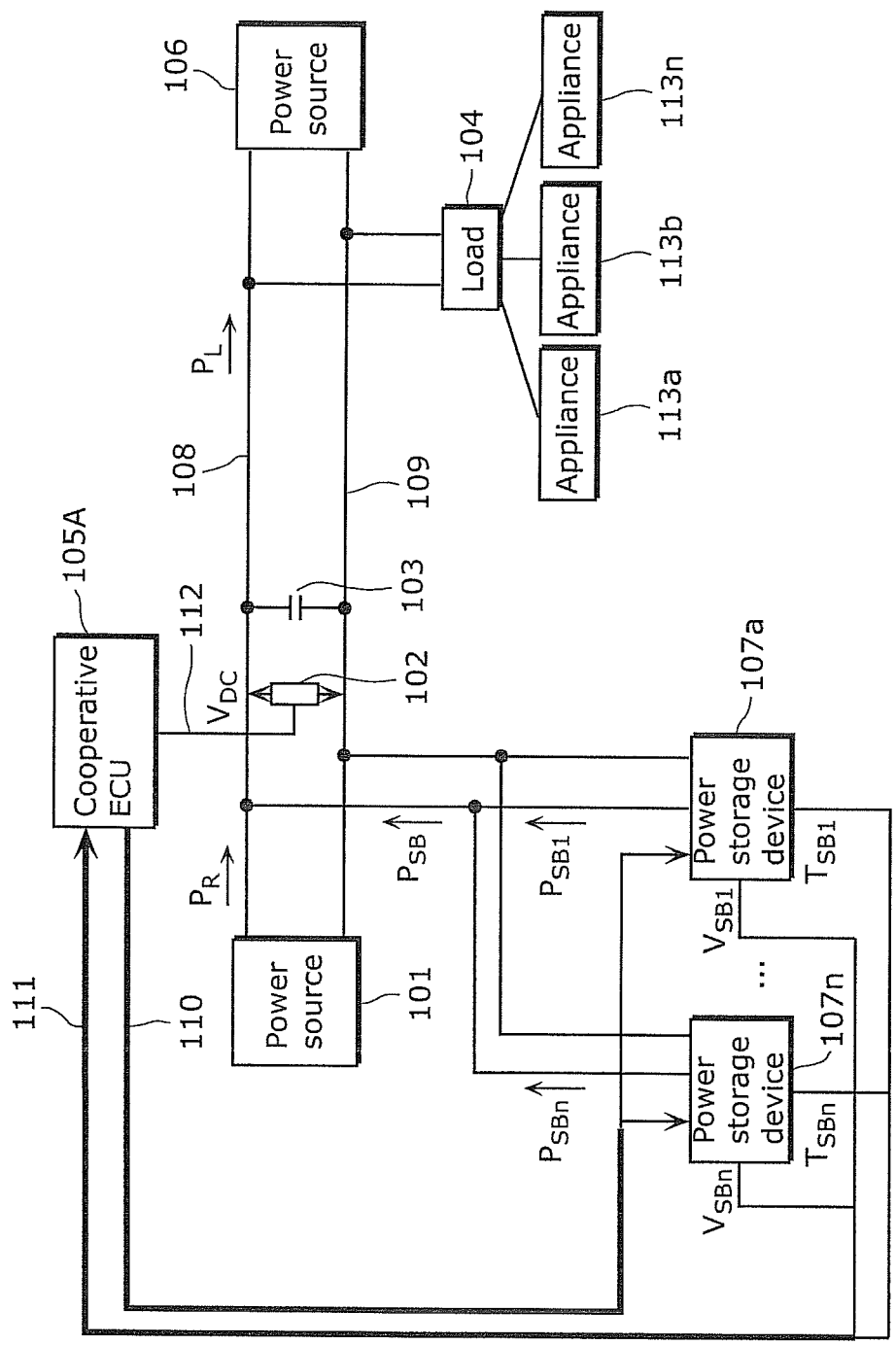
FIG. 12 is a system configuration diagram illustrating a power supply system according to Embodiment 2 of the present invention.

FIG. 12 is a diagram illustrating the configuration of a power supply system included in a cooperative ECU 105A according to the present embodiment. The components same as those in FIG. 1 are labeled with the same reference symbols, and detailed description is omitted.

In FIG. 12, n pieces (n is an arbitrary integer greater than or equal to 2) of the power storage devices are disposed in the present embodiment. That is to say, in the present embodiment, a plurality of storage batteries are connected in parallel with the first power supply line and the second power supply line.

In FIG. 12, the cooperative ECU 105A acquires the voltage and temperature of a storage battery (not shown) provided in each of the power storage devices 107a to 107n from n pieces of power storage devices 107a, 107b, . . . , 107n (subscript n of the reference symbol 107 stands for n-th alphabet counting from letter a, and hereinafter the notation follows the same rule). Accordingly, the cooperative ECU 105A detects the remaining capacity and state of deterioration of each storage battery. The cooperative ECU 105A suppresses the DC link voltage VDC, and informs the power storage devices 107a to 107n of the designated current values ISB1 to ISBn, respectively that have been determined so as to make the remaining capacities of the storage batteries uniform.

Each of the power storage devices 107a to 107n according to the present embodiment has the same configuration and function as those of the power storage device 107 illustrated in FIG. 3, and thus description is omitted herein.

Figure 13:
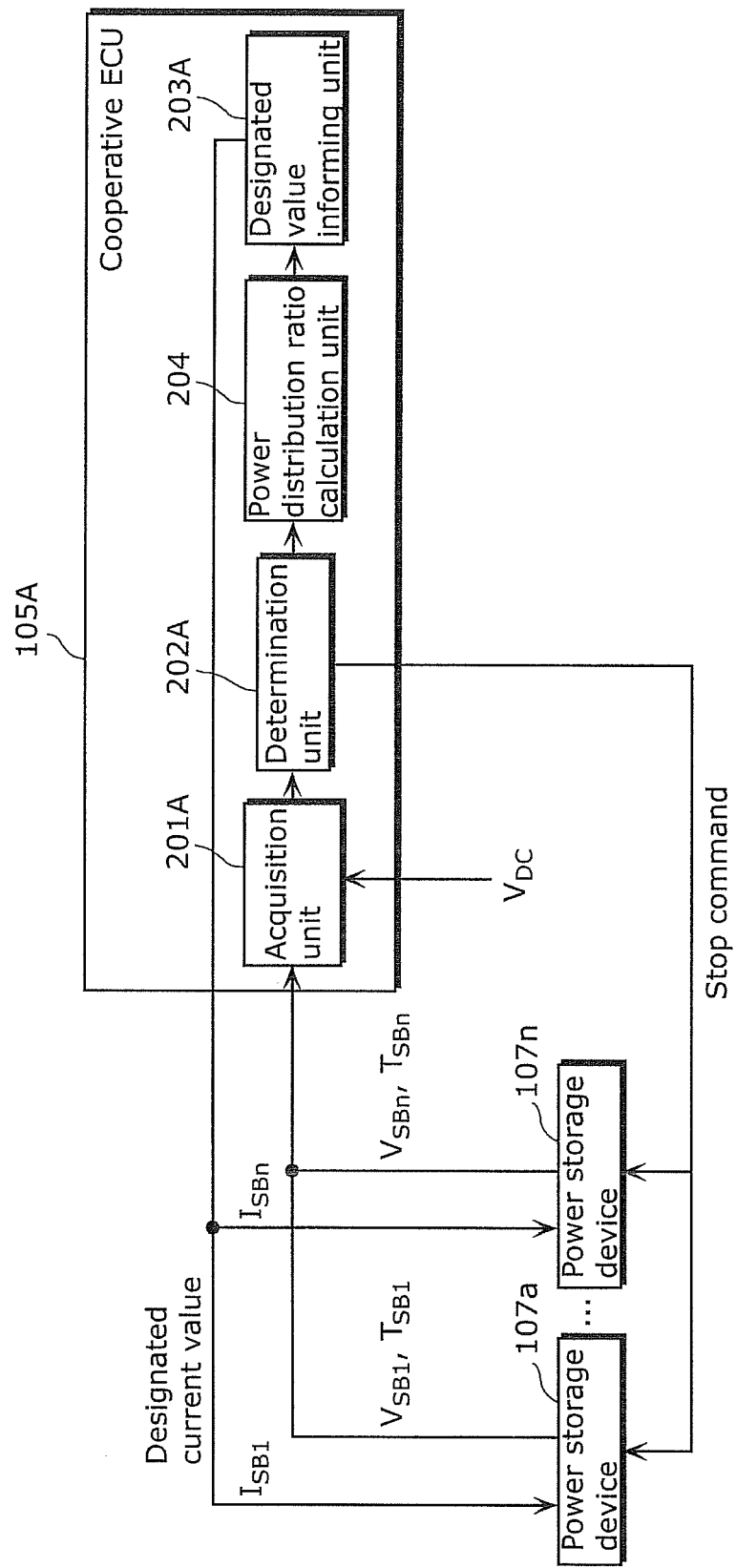
FIG. 13 is a functional block diagram of a cooperative ECU according to Embodiment 2 of the present invention.

FIG. 13 illustrates a functional block diagram of the cooperative ECU 105A according to the present embodiment. As illustrated in FIG. 13, the cooperative ECU 105A according to the present embodiment includes an acquisition unit 201A, a determination unit 202A, a designated value informing unit 203A, and a power distribution ratio calculation unit 204.

The acquisition unit 201A acquires a voltage value from each of the plurality of storage batteries. More specifically, the acquisition unit 201A acquires the voltage and temperature of each of the power storage devices 107a to 107n.

The determination unit 202A calculates SOC and SOH of each of the power storage devices 107a to 107n using the voltage and temperature of each of the power storage devices 107a to 107n that are acquired by the acquisition unit 201A.

The determination unit 202A further determines the total power PSB to be charged or discharged to or from the power storage devices 107a to 107n, and the output time TSB in order to suppress the fluctuation energy ΔW.

The power distribution ratio calculation unit 204 calculates a distribution ratio of the power to be outputted by each storage battery in accordance with the ratio of the values corresponding to the SOC among the plurality of storage batteries. More specifically, the power distribution ratio calculation unit 204 determines a distribution ratio of the power to be outputted by each of the power storage devices 107a to 107n based on the detected voltage value of each storage battery.

The designated value informing unit 203A calculates a designated current value of each of the plurality of storage batteries based on the power to be outputted by the storage batteries which is determined by the determination unit 202A, and the distribution ratios calculated by the power distribution ratio calculation unit 204. Furthermore, each of the calculated designated current value is notified to the corresponding storage battery.

The designated value informing unit 203A determines power PSB1 to PSBn to be outputted by the respective power storage devices 107a to 107n, based on SOC of each storage battery, and the total power PSB and the power distribution ratios that are determined by the determination unit 202A. Subsequently, designated current values ISB1 to Isbn, each of which corresponding to each power, are determined as the amount of current to be charged or discharged to or from each of the power storage devices 107a to 107n. Subsequently, the designated value informing unit 203 informs the power storage device 107a to 107n of the determined designated current values ISB1 to Isbn, respectively via the network 110.

Next, the operation of the cooperative ECU 105A configured in the above-described manner according to the present embodiment is described with reference to the drawings.

Figure 14:
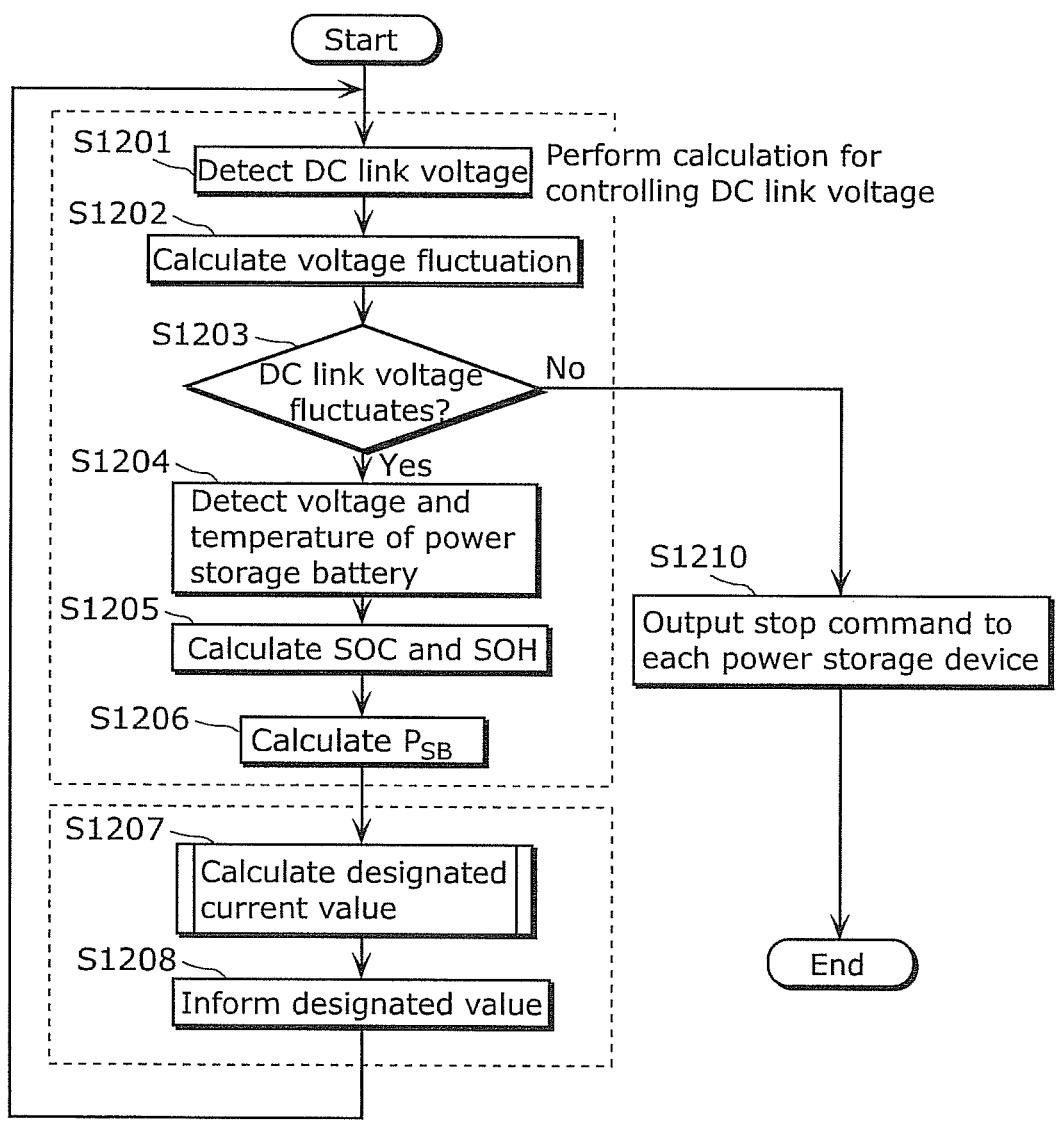
FIG. 14 is a flowchart illustrating the flow of the process performed by the cooperative ECU according to Embodiment 2 of the present invention.

FIG. 14 is a flowchart illustrating the flow of the process performed by the cooperative ECU 105A according to the present embodiment. The cooperative ECU 105A suppresses the fluctuation component of the DC link voltage VDC, and determines designated current values ISB1 to Isbn to be respectively outputted by the plurality of power storage devices 107a to 107n so as to make the remaining capacities of the power storage devices 107a to 107n uniform.

In the present process, the respective processes in steps S1201 to S1206 excluding step S1207 are the same as the respective processes in steps S601 to S606 described in FIG. 6, thus detailed description is omitted herein.

First, the acquisition unit 201A provided in the cooperative ECU 105A detects the DC link voltage VDC (S1201). Next, the determination unit 202A calculates the fluctuation component ΔV of the DC link voltage (S1202).

The determination unit 202A when determining that the DC link voltage VDC has no fluctuation component (No in S1203), transmits a stop command for current control to the power storage device 107 to terminate the present process (S1210).

On the other hand, the determination unit 202A when determining that the DC link voltage VDC has a fluctuation component (Yes in S1203), acquires the voltage and temperature values of the storage battery in each of the power storage devices 107a to 107n by the acquisition unit 201A (S1204).

Next, the determination unit 202A calculates the fluctuation energy ΔW which corresponds to the fluctuation component of the DC link voltage VDC of the capacitor 103. In addition, the determination unit 202A determines the SOH of each storage battery from the voltage and temperature that have been obtained in step S1204 (S1205). The determination unit 202A then determines the total power PSB to be charged or discharged to or from each power storage device in accordance with the SOH of each storage battery in order to suppress the fluctuation energy ΔW (S1206).

For example, in the present embodiment, the determination unit 202A may determine the output time TSB focused and based on a storage battery with the highest temperature among the plurality of storage batteries, and calculates PSB in accordance with the above-mentioned Expression (2). Alternatively, an upper limit of the power to be outputted by each of the storage batteries may be determined in accordance with the state of deterioration of a storage battery with the highest temperature among the of storage batteries. In this case, when the total power to be outputted by the storage batteries is less than the power needed in order to suppress the ΔW, an upper limit of the power to be outputted by each of the storage batteries except for the storage battery with the highest temperature may be determined in accordance with the state of deterioration of a storage battery with the second highest temperature among the storage batteries. Similarly, an upper limit of the power to be outputted by each of the storage batteries with the (N+1)th highest temperature or less may be determined while incrementing N to reach the total power needed in order to suppress ΔW, in accordance with the state of deterioration of a storage battery with the N-th highest temperature among the storage batteries. In this case, the distribution ratio of each of the storage batteries with the (N+1)th highest temperature or less is determined, for example, in proportional to the temperature. Alternatively, the distribution ratio may be equally set.

Next, the power distribution ratio calculation unit 204 determines the distribution ratio of the power to be outputted by each of the power storage devices 107a to 107n using the voltage of each storage battery, acquired by the acquisition unit 201A. The designated value informing unit 203A then determines the power to be outputted by each of the power storage devices 107a to 107n in accordance with the total power PSB and the power distribution ratio of each storage battery. The current value corresponding to each power is further determined as the designated current values ISB1 to Isbn for the respective power storage devices (S1207).

The detail of the step S1207 is described below in FIG. 15. Subsequently, the designated value informing unit 203A informs the power storage devices 107a to 107n of the determined designated current values ISB1 to Isbn, respectively (S1208).

Figure 15:
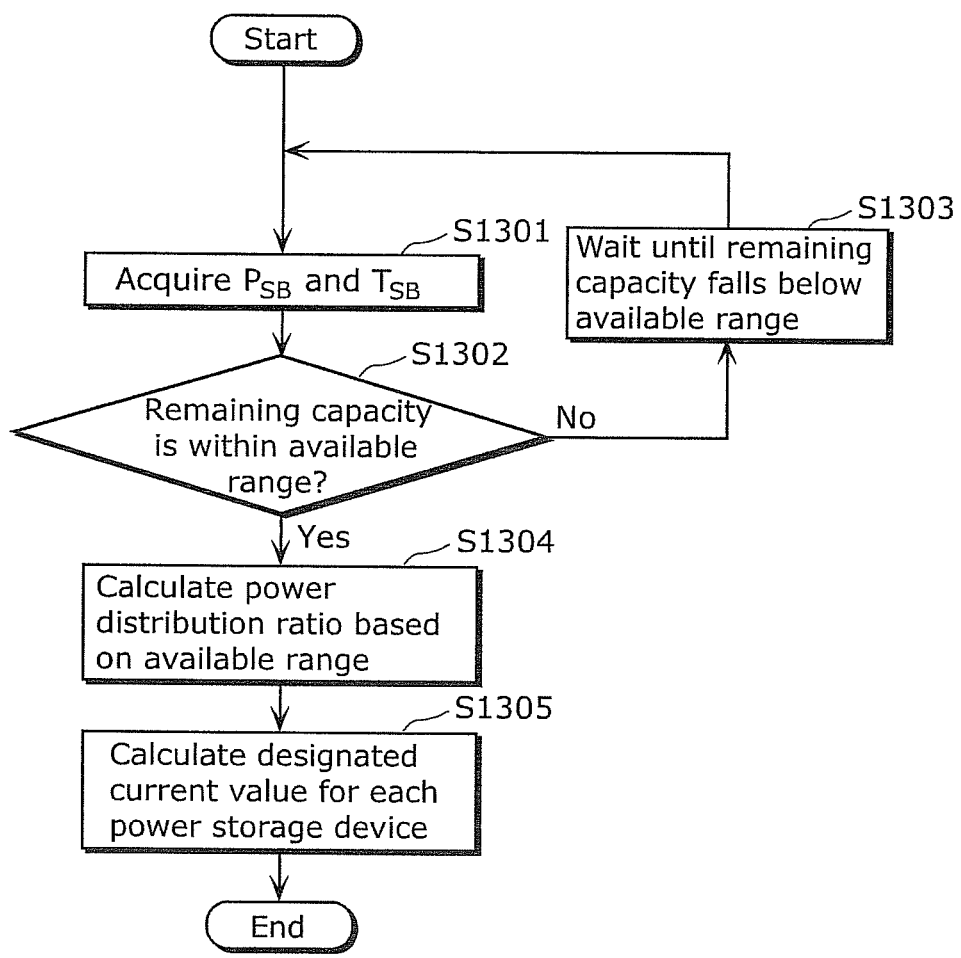
FIG. 15 is a flowchart illustrating the detailed flow of the process performed in step S1207 in FIG. 14 in the cooperative ECU according to Embodiment 2 of the present invention.

FIG. 15 is a flowchart illustrating the detailed flow of the designated current value calculation process performed by the cooperative ECU 105A in step S1207 in FIG. 14. In the present process, the respective processes in steps S1301 to S1305 excluding step S1304 in FIG. 15 are the same as the respective processes in steps S801 to S805 excluding step S804 described in FIG. 10, thus detailed description is omitted herein.

First, the power distribution ratio calculation unit 204 acquires, from the determination unit 202A, the total power PSB to be outputted by the power storage devices, and the value corresponding to the SOC of each storage battery (S1301). Next, the power distribution ratio calculation unit 204 determines whether or not the remaining capacity of each storage battery is within the available range based on the SOC of each storage battery (S1302).

When there is a storage battery whose remaining capacity is not within the available range in step S1302, the cooperative ECU 105A waits until the storage battery is charged or discharged so as to fall within the available range (S1303).

On the other hand, when each storage battery is within the available range in step S1302, the cooperative ECU 105A calculates the distribution ratio of the power to be outputted by each of the power storage devices using the voltage value of each acquired storage battery so as to make the remaining capacities of the storage batteries uniform (S1304). The detail of the calculation method is described below in FIG. 17.

Figure 16:
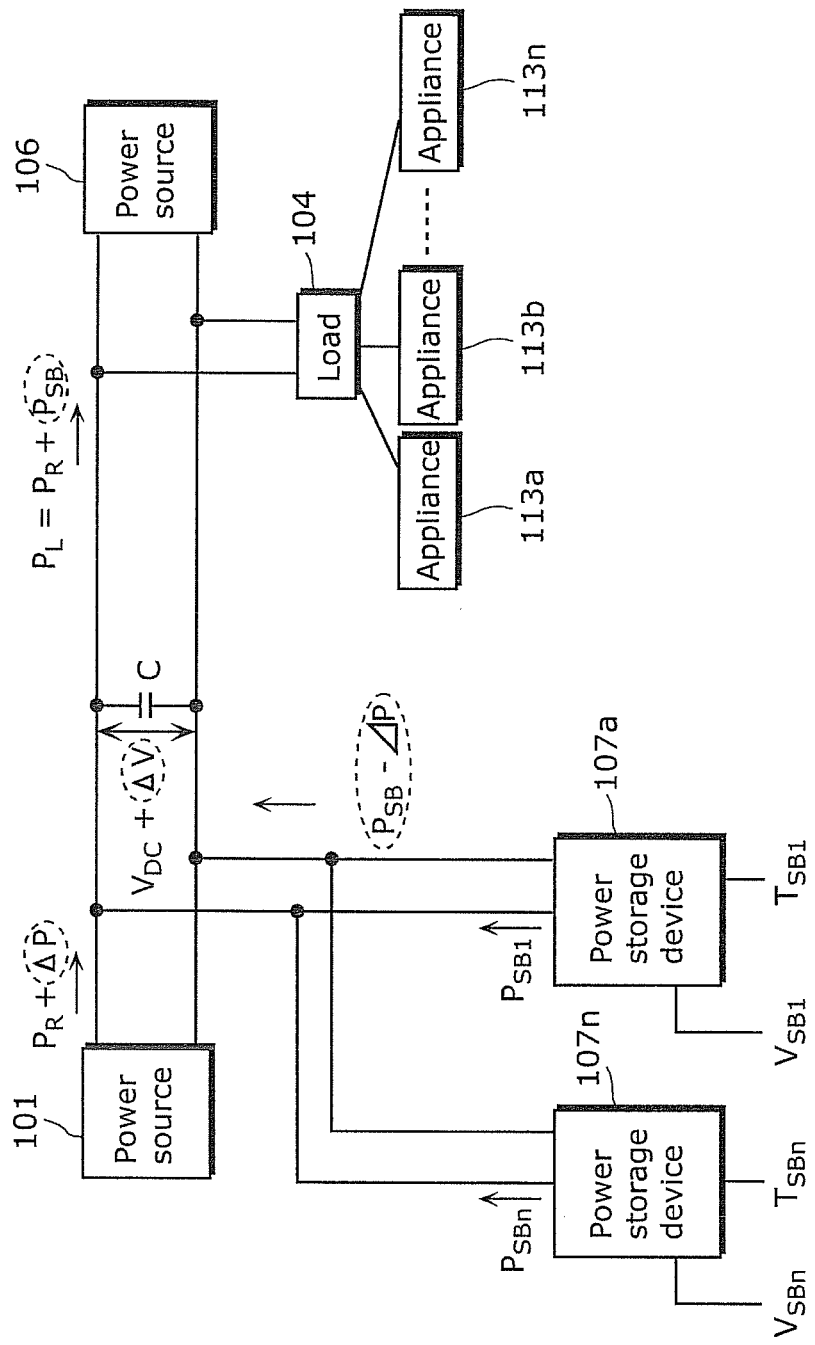
FIG. 16 is a diagram for explaining a method for compensating a fluctuation of DC link voltage in the cooperative ECU according to Embodiment 2 of the present invention.

Next, the designated value informing unit 203A determines the designated current values ISB1 to Isbn to be outputted by the power storage devices 107a to 107n, respectively, in accordance with each power distribution ratio. That is to say, as illustrated in FIG. 16, the designated value informing unit 203A determines the designated current values ISB1 to Isbn to be outputted by the power storage devices 107a to 107n, respectively, so that PSB−ΔP=PSB1+PSB2+ . . . PSBn.

Figure 17:
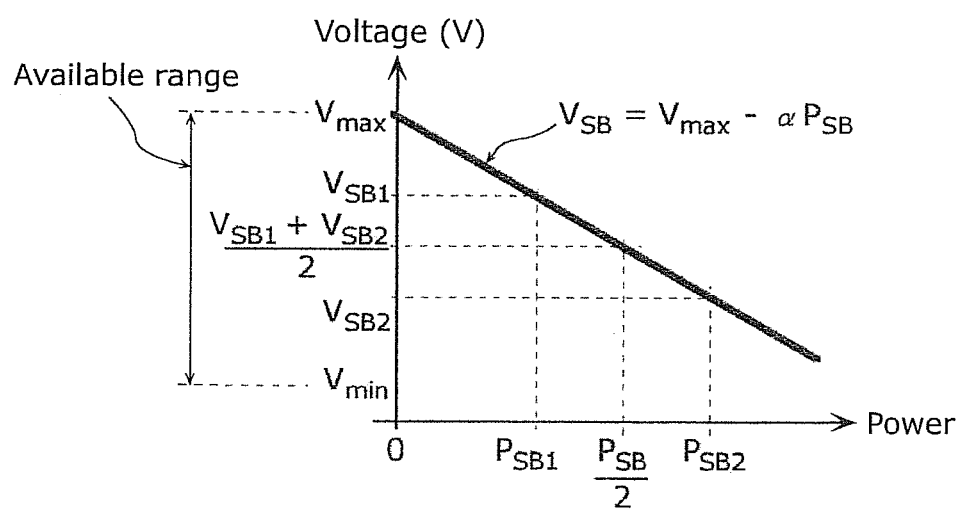
FIG. 17 is a graph for explaining an exemplary method for calculating a power distribution ratio corresponding to each power storage device in the cooperative ECU according to Embodiment 2 of the present invention.

FIG. 17 is a graph for explaining an exemplary method described in step S1304 in FIG. 15 for calculating a power distribution ratio corresponding to each power storage device, the calculation being performed by the designated value informing unit 203A. The power distribution ratio α in the present calculation method is calculated by the following Expression (3). α corresponds to the slope of the line illustrated in FIG. 17.

[Expression 3]

$$\alpha = \frac{2V_{max} - (V_{SB1} + V_{SB2})}{P_{SB}} \quad (3)$$

Expression (3) is an example for the case where two power storage devices are provided. Here, it is assumed that the two power storage devices are the power storage device 107a and the power storage device 107b. The power storage devices are assumed to have the storage battery A and the storage battery B, respectively.

The designated value informing unit 203A calculates the power distribution ratio α in accordance with Expression (3) based on the power PSB obtained in step S1301 in FIG. 15, the voltage values of the storage battery A and the storage battery B, and a maximum voltage value Vmax in the available range of the storage battery A and the storage battery B. The maximum voltage value Vmax is recorded, for example, in the cooperative ECU 105A in advance.

Next, the designated value informing unit 203A determines respective designated power values PSB1, PSB2 of the storage battery A and the storage battery B in accordance with the following Expression (4) using the determined power distribution ratio α.

[Expression 4]

$$\begin{cases} P_{SB1} = \frac{1}{\alpha}(V_{max} - V_{SB1}) \\ P_{SB2} = \frac{1}{\alpha}(V_{max} - V_{SB2}) \end{cases} \quad (4)$$

It can be seen from Expression (3) that the power distribution ratio α varies in accordance with the respective designated power values PSB1, PSB2 of the storage battery A and the storage battery B. That is to say, the power PSB (i.e., PSB1 and PSB2) to be charged or discharged to or from each of the storage battery A and the storage battery B are variably set in accordance with the remaining capacities of the storage battery A and the storage battery B. Here, Vmax−VSB1 is the value corresponding to the SOC. Therefore, the power distribution ratio calculation unit 204 calculates a distribution ratio of the power to be outputted by each storage battery in accordance with the ratio of the values corresponding to the SOC among the storage batteries.

Subsequently, the designated value informing unit 203A calculates ISB (i.e., ISB1 and ISB2) by dividing the PSB by the voltage of the storage battery.

In the above, the operation of the cooperative ECU 105A according to the present embodiment has been described with reference to FIGS. 14 to 17. According to the present aspect, the cooperative ECU 105A acquires the voltage and temperature values of a storage battery provided in each of the power storage devices, from the power storage devices 107a to 107n. The cooperative ECU 105A then suppresses the fluctuation component of the DC link voltage, and determines respective current values to be charged or discharged to or from the power storage devices 107a to 107n so as to make the remaining capacities of the power storage devices uniform, based on the acquired voltage value and temperature value.

Accordingly, the cooperative ECU 105A can calculate a distribution ratio of the power to be charged or discharged to or from each of the storage batteries in accordance with the remaining capacity of the storage battery. Consequently, a variation in the remaining capacities of the storage batteries can be suppressed. In addition, stable power can be supplies to the load 104 by suppressing the fluctuation component of the DC link voltage. Furthermore, a reduction in the life of each storage battery can be reduced.

Embodiment 3

In Embodiment 1 and Embodiment 2, the case has been described where the power supplied to the load is DC.

In Embodiment 3, a case is described where the power supplied to the load is AC.

Hereinafter, the cooperative ECU used in Embodiment 3 of the present invention is described.

Figure 18:
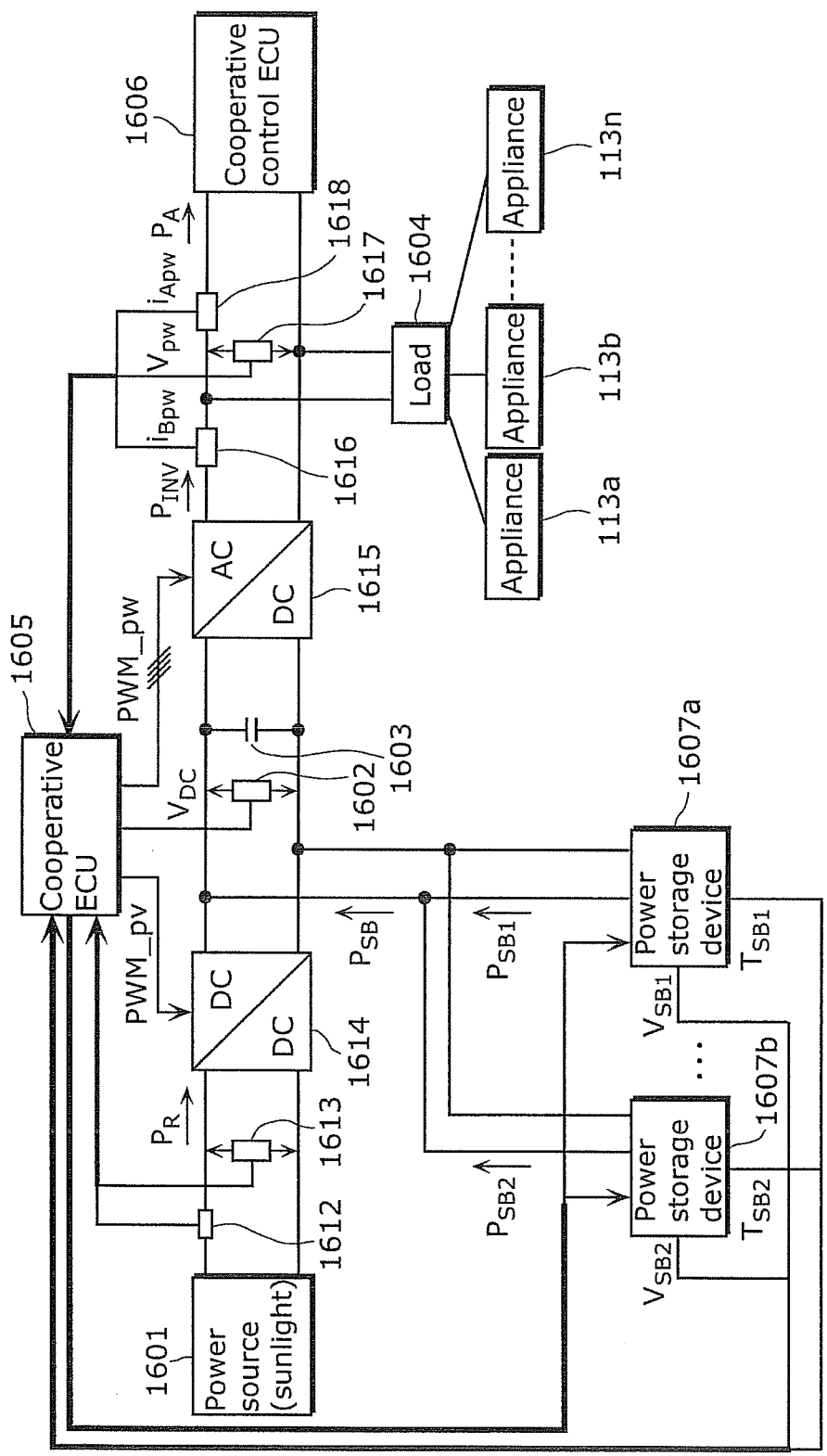
FIG. 18 is a system configuration diagram illustrating a power supply system according to Embodiment 3 of the present invention.

FIG. 18 is a system configuration diagram illustrating a power supply system including a cooperative ECU1 605 as a power control device according to the present embodiment. In FIG. 18, the power generated by a power generation system using renewable energy is supplied by a power source 1601 in the present embodiment.

In the present aspect, the power source 1601 generated by a solar photovoltaic power generation system is described as an example of renewable energy, however, as another example of renewable energy, a power generation system which uses energy such as wind power, solar heat, geothermal heat, ocean current, wave power, or tidal power may be applied. In the present embodiment, a load 1604 is configured with an AC load.

The power source 1601 supplies the power generated by a solar photovoltaic power generation system. The solar photovoltaic power generation system has a PV (Photo Voltaic) panel containing a solar cell.

A voltage detection unit 1613 detects the voltage of the power source 1601. Specifically, the voltage of the solar cell is detected in this case. A current detection unit 1612 detects the current which flows from the power source 1601.

A voltage detection unit 1617 detects the voltage applied to the load 1604. A current detection unit 1616 detects an output current of a DC/AC conversion unit 1615.

A DC/DC conversion unit 1614 receives a switching signal PWM_pv outputted from the cooperative ECU 1605. The DC/DC conversion unit 1614 further outputs the power which is converted from sunlight energy based on the switching signal PWM_pv. In this case, the cooperative ECU 1605 performs MPPT (Maximum Power Point Tracking control) on a modulation wave conduction ratio and a switching cycle in the PWM (Pulse Width Modulation) system in accordance with the voltage value of the solar cell, detected by the voltage detection unit 1613.

The DC/AC conversion unit 1615 receives a switching signal PWM_pw outputted from the cooperative ECU 1605. The DC/AC conversion unit 1615 further converts the inputted DC power into AC power PINV and outputs the AC power PINV, based on the switching signal PWM_pw. In this case, the cooperative ECU 1605 calculates the power value PINV outputted from the DC/AC conversion unit 1615 based on a voltage value Vpw detected by the voltage detection unit 1617, and a current value iBpw detected by the current detection unit 1616. The cooperative ECU 1605 further performs feedback control to control the modulation wave conduction ratio in the PWM system in accordance with the difference between the output power value PINV and a desired designated power value.

The cooperative ECU 1605 generates a switching signal for performing output control of each of the DC/DC conversion unit 1614 and the DC/AC conversion unit 1615. The cooperative ECU 1605 further outputs the generated switching signal to each of the DC/DC conversion unit 1614 and the DC/AC conversion unit 1615. In addition, the cooperative ECU 1605 determines a designated current value to be charged or discharged to or from a power storage device 1607*a* and a power storage device 1607*b*. Hereinafter, the power storage device 1607*a* and the power storage device 1607*b* are collectively referred to as a power storage device 1607.

The designated current value transmitted to each power storage device compensates the power for compensating a voltage variation component of the DC link voltage VDC detected by the voltage detection unit 1602, and shortfall in the output power of the DC/AC conversion unit 1615 which is needed to supply the load 1604.

Figure 19:
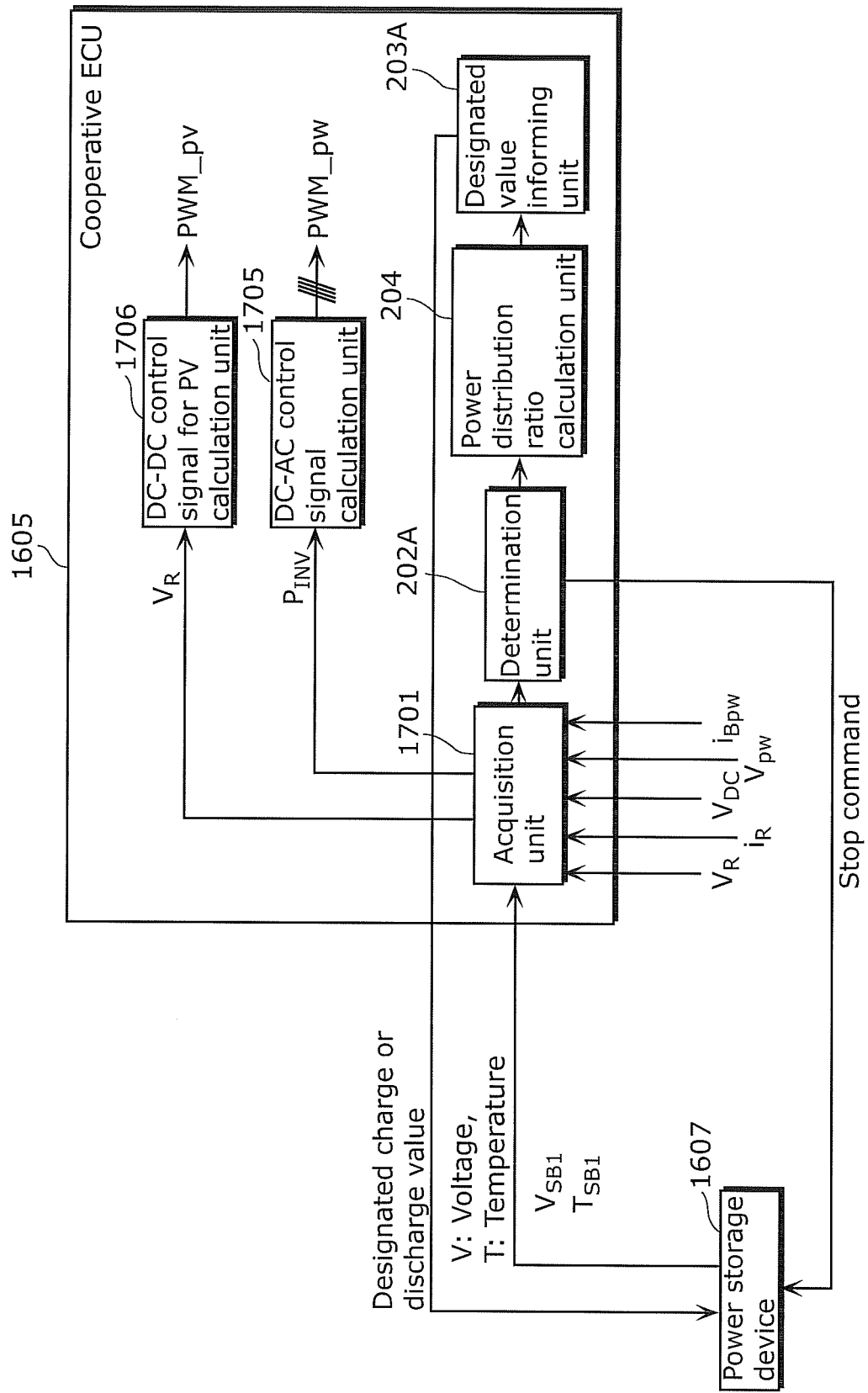
FIG. 19 is a functional block diagram of a cooperative ECU according to Embodiment 3 of the present invention.

FIG. 19 illustrates a functional block diagram of the cooperative ECU 1605 according to the present embodiment. The blocks for the determination unit 202A, the designated value informing unit 203A, and the power distribution ratio calculation unit 204 that are illustrated in FIG. 19 have the same function as the respective blocks described in FIG. 13, thus are labeled with the same reference symbols, and description is omitted.

An acquisition unit 1701 acquires a voltage VR of the solar cell, and an output current iR of the solar cell, AC side voltage Vpw of the DC/AC conversion unit 1615, and an output current iBpw of the DC/AC conversion unit 1615. The acquisition unit 1701 then calculates the output power value PINV of the DC/AC conversion unit 1615.

A DC-AC control signal calculation unit 1705 performs output control of the power value PINV calculated by the acquisition unit 1701. Specifically, the DC-AC control signal calculation unit 1705 generates a PWM switching signal PWM_pw for driving the DC/AC conversion unit 1615. In addition, the DC-AC control signal calculation unit 1705 calculates a power value PA which flows through a power source 1606, based on the voltage value detected by the voltage detection unit 1617, and the current value detected by the current detection unit 1618.

A DC-DC control signal calculation unit 1706 for PV performs MPPT control in accordance with the detected voltage value VR of the solar cell. Specifically, the DC-DC control signal calculation unit 1706 for PV generates a PWM switching signal PWM_pw for driving the DC/DC conversion unit 1614.

Figure 20:
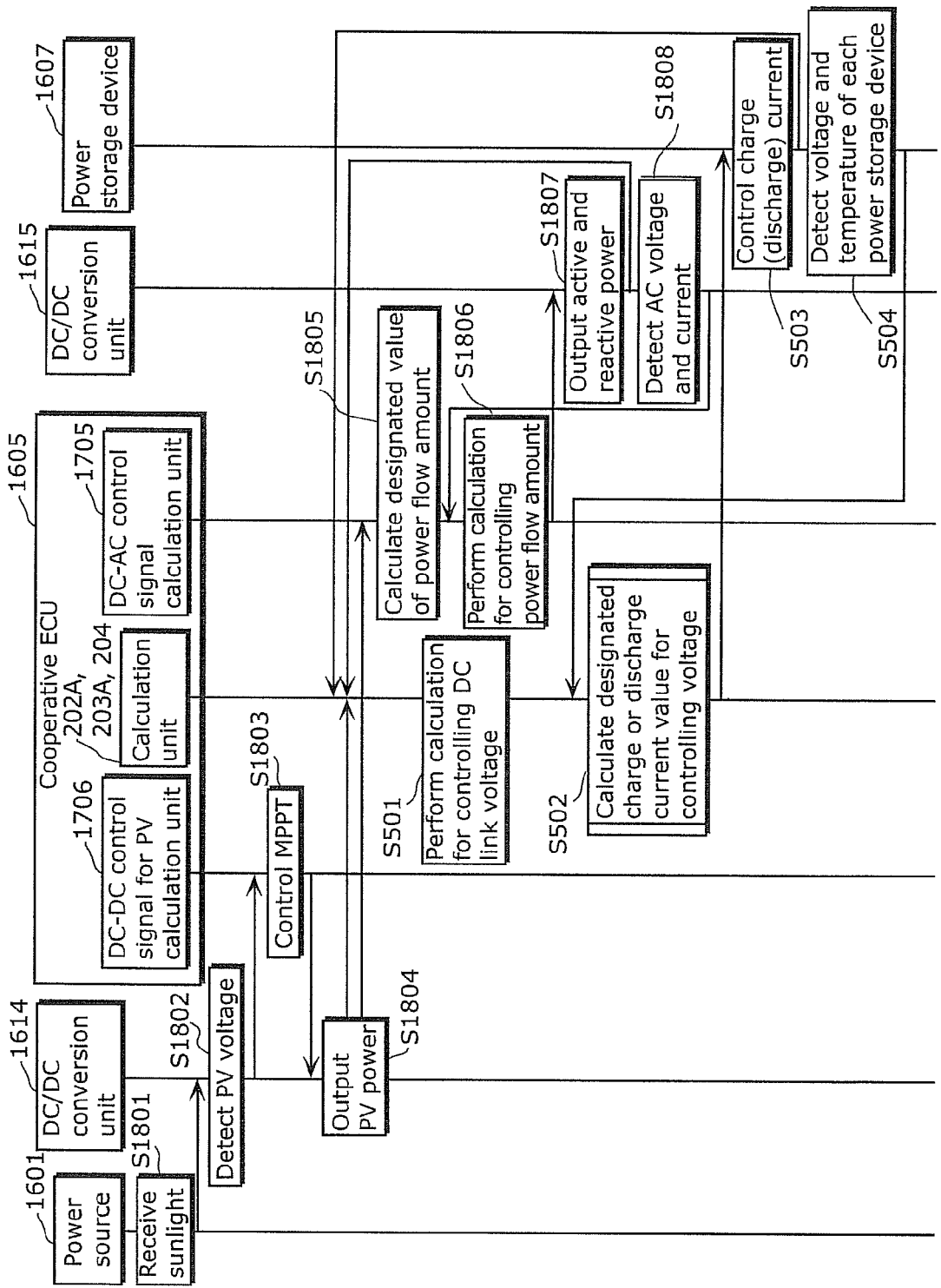
FIG. 20 is a sequence diagram illustrating the flow of the process performed by the cooperative ECU and the power storage device in the power supply system according to Embodiment 3 of the present invention.

FIG. 20 is a sequence diagram illustrating the operation of the power source 1601, the cooperative ECU 1605, the power storage device 1607, the DC/DC conversion unit 1614, and the DC/AC conversion unit 1615 that are included in a power supply system according to the present embodiment. In FIG. 20, the determination unit 202A, the designated value informing unit 203A, and the power distribution ratio calculation unit 204 are collectively denoted as a calculation unit.

The output power of the DC/DC conversion unit 1614 is power that flows into the capacitor 1603. On the other hand, the output power of the DC/AC conversion unit 1615 is power that is outputted from the capacitor 1603.

In the case where the power source 1601 is a solar photovoltaic power generation system, the output power of the DC/DC conversion unit 1614 and the output power of the DC/AC conversion unit 1615 are not matched. This is because the power source 1601 utilizes the sunlight which is fluctuating energy. For this reason, a difference occurs between the power inputted to the capacitor 1603 and the power outputted from the capacitor 1603. Consequently, the DC link voltage VDC fluctuates. Thus, the cooperative ECU 1605 according to the present embodiment detects the power (i.e., the voltage and current outputted from the solar cell) inputted to the DC/AC conversion unit 1615, and the power outputted from the DC/DC conversion unit 1614. In addition, the cooperative ECU 1605 suppresses (i.e., compensates the fluctuation component so as to negate it) the fluctuation component of the DC link voltage VDC generated from each of the detected power.

Hereinafter, detailed description is provided.

First, the power source 1601 which is a solar photovoltaic power generation system receives sunlight, and converts the received solar energy into a voltage within the solar cell (S1801).

Next, the DC/DC conversion unit 1614 detects the voltage value by the voltage detection unit 1613. Subsequently, the DC/DC conversion unit 1614 transmits the detected voltage value to the cooperative ECU 1605 (S1802). In the present embodiment, the voltage detection unit 1613 is described as part of the DC/DC conversion unit 1614, however, the voltage detection unit 1613 may be configured to be independent from the DC/DC conversion unit 1614 as illustrated in FIG. 18.

Upon receiving the voltage value from the voltage detection unit 1613, the cooperative ECU 1605 performs MPPT control and PWM control by the DC-DC control signal calculation unit 1706. Subsequently, the voltage detection unit 1613 transmits the PWM switching signal to the DC/DC conversion unit 1614 (S1803). The DC/DC conversion unit 1614 receives the PWM switching signal transmitted from the cooperative ECU 1605, and outputs the power corresponding to the operating point of the maximum power in the voltage and the current characteristic of the solar cell (S1804).

Next, the DC-AC control signal calculation unit 1705 determines a designated flow amount for supplying the power generated by the power source 1601, which is a solar photovoltaic power generation system, to the load 1604, or controlling the charge or discharge power to the power storage device 1607 (S1805). The DC-AC control signal calculation unit 1705 performs feedback control based on the designated flow amount, and the output power PINV of the DC/AC conversion unit 1615. By the feedback control, the DC-AC control signal calculation unit 1705 generates a PWM switching signal for driving the DC/AC conversion unit 1615. Subsequently, the DC-AC control signal calculation unit 1705 transmits the generated PWM switching signal to the DC/AC conversion unit 1615 (S1806).

Then upon receiving the PWM switching signal, the DC/AC conversion unit 1615 outputs active power and reactive power to the cooperative ECU 1605 based on the PWM switching signal (S1807). In addition, the DC/AC conversion unit 1615 converts the DC power outputted from the DC/DC conversion unit 1614 into PINV in order to perform feedback control for output power. Subsequently, the DC/AC conversion unit 1615 informs the cooperative ECU 1605 of the PINV via the current detection unit 1616 and the voltage detection unit 1617 (S1808).

The cooperative ECU 1605 acquires the voltage and temperature of the storage battery 304 from the power storage device 1607. In addition, the cooperative ECU 1605 acquires a power value from the DC/DC conversion unit 1614, the power value being outputted by the power source 1601. The cooperative ECU 1605 further acquires the PINV from the DC/AC conversion unit 1615. The PINV includes the active power and the reactive power.

Subsequently, the cooperative ECU 1605 performs processes similar to the processes described in steps S501 to S502 in FIG. 5. The power storage device 1607 performs processes similar to the processes described in steps S503 to S504 in FIG. 5.

As described above, in the present embodiment, the power source 1601, which is a predetermined power generation unit, is configured with a power generation system utilizing green energy. The load 1604 is configured with an AC load. Here, the DC/DC conversion unit 1614 is connected between the predetermined power generation unit and the capacitor 1603 so as to convert green energy into DC power. The DC/AC conversion unit 1615 is connected between the capacitor 1603 and the load 1604 so as to convert the DC power outputted from the DC/DC conversion unit 1614 into AC power. The acquisition unit 1701 further acquires power values outputted from the DC/DC conversion unit 1614 and the DC/AC conversion unit 1615, respectively. The determination unit 202A determines a power to be outputted by the storage battery so as to suppress the difference between the power values that are outputted from the DC/DC conversion unit 1614 and the DC/AC conversion unit 1615, respectively.

According to the present aspect, when the cooperative ECU 1605 converts DC power into AC power and supplying the AC power to the load 1604, the DC power being generated by using renewable energy such as sunlight, the cooperative ECU 1605 detects the DC link voltage VDC, the power that is outputted from the solar cell to be supplied to the DC/DC conversion unit 1614, and the power outputted from the DC/AC conversion unit 1615. Accordingly, even when the fluctuation component of the DC link voltage VDC includes the fluctuation components of the above-mentioned power, the cooperative ECU 1605 can suppress the fluctuation component of the DC link voltage so as to supply stable power to the load. Furthermore, a reduction in the life of the storage battery can be reduced.

A plurality of facilities in which the power control devices according to Embodiments 1 to 3 are installed may be linked to the same power distribution network.

Figure 21:
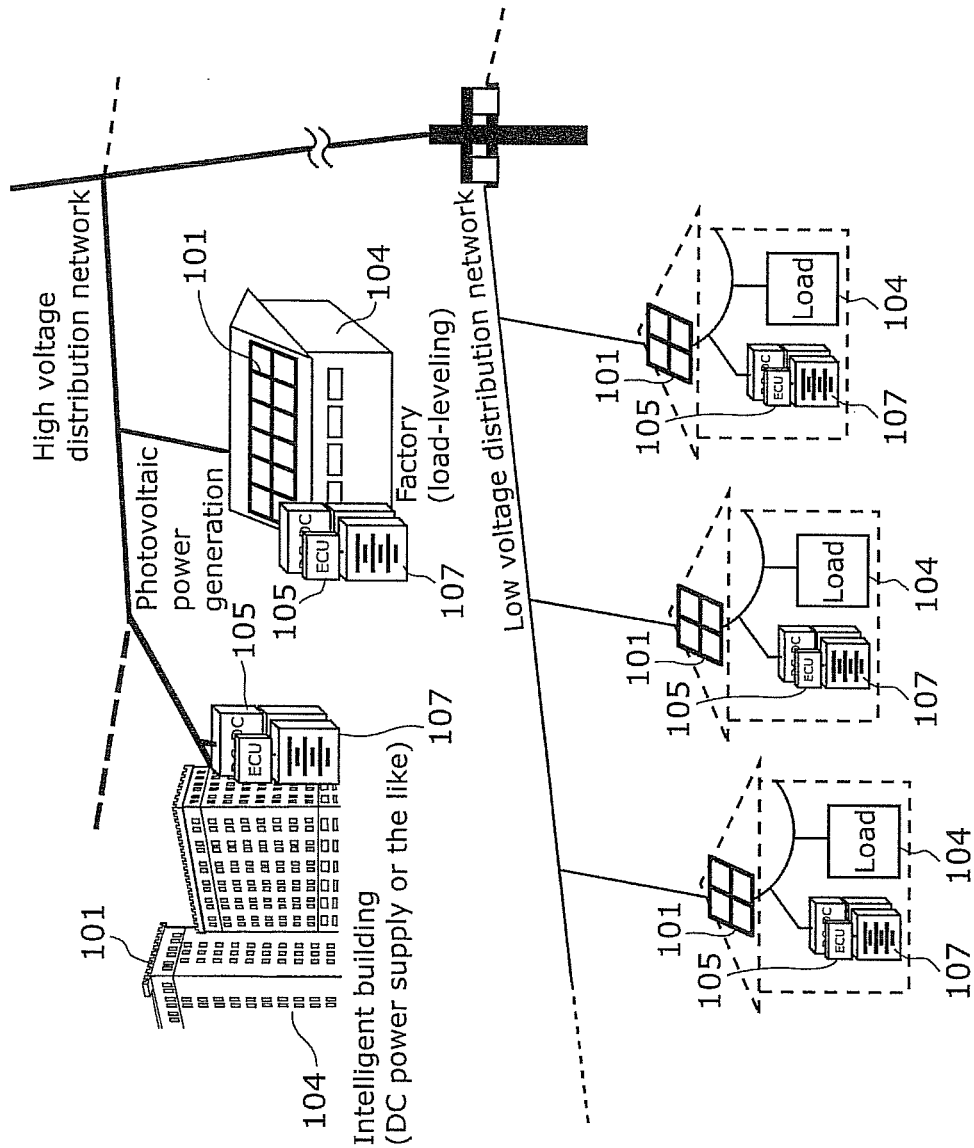
FIG. 21 is a system configuration diagram illustrating an exemplary power supply system in which a power control device, a plurality of power storage devices, and a power control method according to Embodiments 1 to 3 of the present invention are used.

FIG. 21 is a conceptual diagram illustrating an example in which a plurality of facilities in which the cooperative ECU 105 is installed are linked to the same power distribution network.

In FIG. 21, a plurality of factories and buildings in which the cooperative ECU 105 according to the present embodiment is installed are linked to a high voltage power distribution network. A plurality of users' houses in which the cooperative ECU 105 is installed are linked to a low voltage power distribution network. In each of these factories, buildings, and users' houses, a solar photovoltaic power generation system and the power storage device 107 which accumulates the power generated by the solar photovoltaic power generation system are installed. Power is supplied from the solar photovoltaic power generation system and the power distribution networks to the load 104 of each facility. That is to say, in FIG. 21, the load 104, the power storage device 107, and the power source 101 generated by a solar photovoltaic power generation system are installed together in each facility.

Each power storage device 107 supplies stable power to each load 104 by suppressing a voltage fluctuation caused by fluctuating power outputted from the solar photovoltaic power generation system. The power storage device 107 is charged during night when power demand is low, and is discharged during daytime when power demand is high. Accordingly, the power is made uniform and electric charge can be saved.

The cooperative ECU 105 controls the operation of the power storage device 107 provided in each facility. Specifically, the cooperative ECU 105 performs cooperative control of the power storage device provided in each facility.

For example, in the case of the system illustrated in FIG. 21, the cooperative ECU 105 detects the voltage and temperature of each storage battery provided in the factories, buildings, and the users' houses. Accordingly, the cooperative ECU 105 detects the charge amount which is the remaining capacity of the power storage device 107 provided in each facility. Consequently, the cooperative ECU 105 supplies power from a power storage device 107 having a large charge amount to a power storage device 107 having a small charge amount.

For example, the cooperative ECU 105 may determine that a power storage device 107 whose charge amount is in the highest 30% of the charge amounts of the entire power storage devices is classified as a power storage device 107 having a large charge amount. The cooperative ECU 105 may determine that a power storage device 107 whose charge amount is in the lowest 30% of the charge amounts of the entire power storage devices is classified as a power storage device 107 having a small charge amount.

A threshold value may be defined as a charge amount, or a charge ratio which is a ratio of a charge amount with respect to a full charge amount. In this case, the cooperative ECU 105 may classify a power storage device 107 having a charge amount or a charge ratio with a predetermined threshold value or greater as a power storage device 107 having a large charge amount. Similarly, the cooperative ECU 105 may classify a power storage device 107 having a charge amount or a charge ratio with a predetermined threshold value or less as a power storage device 107 having a small charge amount.

Furthermore, the cooperative ECU 105 may use a combination of the above-described conditions (for example, a power storage device 107 having a charge amount in the highest 30% and greater than or equal to a predetermined threshold value is classified as a power storage device 107 having a large charge amount).

Accordingly, the cooperative ECU 105 can control the balance in the charge amounts among the power storage devices 107 installed in each facility. Consequently, the loads of the power storage devices 107 can be leveled. Therefore, deterioration of the entire power storage devices 107 can be reduced.

The cooperative ECU according to Embodiments 1 to 3 may be installed as a single unit for a plurality of loads.

Figure 22:
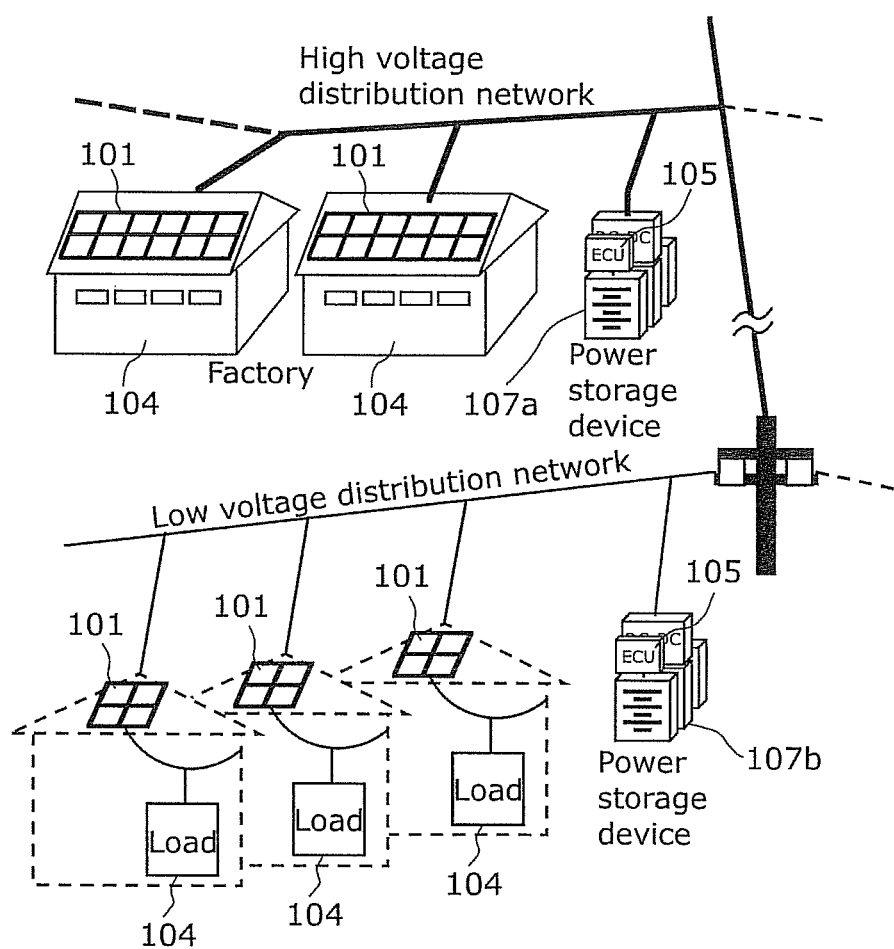
FIG. 22 is a system configuration diagram illustrating another exemplary power supply system in which the power control device, the plurality of power storage devices, and the power control method according to Embodiments 1 to 3 of the present invention are used.

FIG. 22 is a conceptual diagram illustrating an example in which a single cooperative ECU 105 is installed for a plurality of the loads 104.

In FIG. 22, a plurality of facilities in which the cooperative ECU 105 according to the present embodiment is installed include a plurality of factories connected to the high voltage power distribution network, and a plurality of users' houses connected to the low voltage power distribution network. A solar photovoltaic system is installed in each of these factories and the users' houses.

In FIG. 22, the factories or the users' houses form one load group. One cooperative ECU and one power storage device are installed correspondingly to each group. For example, the power storage device 107a is installed correspondingly to one load group such as collective housing. The power storage device 107a supplies stable power to the load of each room. By installing the power storage device 107a, electric charge can be saved because of effective use of power during night. Furthermore, coordination is achieved within each load group so that a power supply stabilizing system is established. Similarly, the power storage device 107b is installed in a load group which includes a plurality of factories.

The cooperative ECU 105 performs cooperative control over the power storage device installed correspondingly to each load group. Accordingly, the cooperative ECU 105 can control the balance in the remaining capacity of the power storage device provided in each group. Consequently, deterioration of the entire power storage device can be reduced.

In the above, the cooperative ECU which is a power control device according to Embodiments 1 to 3 of the present invention has been described.

However, the present invention is not limited to these embodiments. As long as not departing from the spirit of the present invention, modified embodiments obtained by making various modifications, which occur to those skilled in the art, to the above embodiments, and the embodiments that are constructed by combining a plurality of components described above are also included in the scope of the present invention.

In the power control device according to Embodiments 1 to 3, the determination method of SOH is not limited to the method described in step S605 in FIG. 6.

In the case where SOH is determined by using the voltage characteristic illustrated in FIG. 7, SOH is calculated in step S605 as a ratio of an elapsed time from a full charge state to a state where the terminal voltage is reduced to a predetermined terminal voltage (for example, 3V) or less. However, SOH may be calculated as a ratio of the time in which the terminal voltage decreases linearly from a full charge state.

For example, referring to FIG. 7, the terminal voltage in SOH0 decreases linearly for 4.6 h, while the terminal voltage in SOH3 decreases linearly for 3 h. Thus, when SOH0 is defined as a reference such that SOH=100, SOH may be calculated as SOH=(3/4.6)×100=65 in SOH3.

Alternatively, SOH may be determined, for example, as an absolute value in unit of time, and not as a relative value using a brand-new state as a reference.

Instead of measuring the voltage characteristic illustrated in FIG. 7, for example, accumulable power capacity (Ah) of the storage battery, and the internal resistance value of the storage battery are measured so that SOH may be determined as a value corresponding to the internal resistance value. In general, when deterioration of a storage battery proceeds, the accumulable power capacity (Ah) tends to decrease. The accumulable power capacity (Ah) and the internal resistance value can be approximated by a linear regression equation. That is to say, smaller the accumulable power capacity is, the internal resistance value tends to be larger. Therefore, for each of a plurality of storage batteries in a state of deterioration, a relationship between the accumulable power capacity (Ah) and the internal resistance value of the storage battery is acquired by an experiment. Based on this, SOH can be determined from the internal resistance value by recording the correspondence between the internal resistance value and the SOH on a ROM (Read Only Memory) as data in a table format, for example, and storing the data.

Alternatively, by using no experimental technique but mathematically modeling the storage battery, SOC and SOH may be determined by a simulation using the modeling.

As a mathematical model for the storage battery 304, there are known an electrical equivalent circuit model and a state space model. An estimated value of SOC or SOH can be obtained as a solution of a differential equation using these models.

Furthermore, sequential state recording method may be used in which an input and output of the voltage or the current of the storage battery are recorded as time series data, and the internal state of the battery is estimated based on the data. In this case, the power storage device 107 needs to include a processing unit which measures and records usage history of itself.

The voltage characteristic of the storage battery, or a relationship between increased temperature of the storage battery and an output time are not necessarily measured in advance and recorded on a ROM. For example, a measurement result of a plurality of data which are desired to be associated with may be recorded for a certain time period in the past. Based on the measurement result recorded in this manner, a model in an operating environment may be generated by a statistical technique such as GLM (Generalised Linear Model) or a machine learning technique. By using the model, the power control device according to the present embodiment can perform power control in accordance with an individual state of deterioration of the storage battery. A plurality of data which should be measured may include (1) output time TSB and increased temperature; and (2) terminal voltage and remaining capacity when the temperature and the discharge current are constant.

<Modification>

(1) Part or all of the components that constitute each portion of the present embodiment may be configured with a single system LSI (Large Scale Integration). The system LSI is a super multifunctional LSI which is manufactured by integrating a plurality of constituting portions on a single chip, and specifically is a computer system which is configured by including a microprocessor, a ROM, or a RAM. A computer program is stored in the above-mentioned RAM. The function of the system LSI is achieved by the above-mentioned microprocessor operating in accordance with the above-mentioned computer program.

In addition, each portion of the components that constitute each of the above-mentioned devices may be individually implemented as a single chip, or a single chip may includes part or all of the components.

Here, the relevant part or all of the components is referred to as LSI, however, may be referred to as IC, LSI, super LSI, or Ultra LSI depending on the degree of integration. Alternatively, the technique for circuit integration is not limited to LSI, and the circuit integration may be achieved with a dedicated circuit or a general-purpose processor. FPGA (Field Programmable Gate Array) which can be programmed after an LSI is manufactured, or a reconfigurable processor for which connection and setup of the circuit cells inside the LSI can be reconfigured may be utilized.

Furthermore, in the case where new technology of circuit integration which replaces the LSI is invented due to the progress of semiconductor technology or other emerging technology, naturally, a functional block may be integrated using the technology.

(2) Part or all of the components constituting each device described above may be configured with an IC card or a single module which is detachably attached to each device. The IC card or the module is a computer system including a microprocessor, a ROM, a RAM, and the like. The IC card or the module may include the above-mentioned super-multifunctional LSI. The IC card or the module achieves its function by an operation of the microprocessor in accordance with the computer program. The IC card or the module may have tamper-resistance.

(3) The present invention may be a method described above. In addition, the invention may be a computer program which achieves these methods by a computer, or may be a digital signal including the computer program.

In addition, the present invention may be a computer-readable recording medium, for example, a flexible disk, a hard disk, a CD-ROM, an MO, a DVD, a DVD-ROM, a DVD-RAM, a BD (Blu-ray Disc), a semiconductor memory, or the like, in which the computer program or the digital signal is recorded. In addition, the present invention may be the digital signal recorded in one of these recording media.

In addition, the present invention may be transmission in which the computer program or the digital signal is transmitted via an electric telecommunication line, a wireless or wire communication line, a network represented by Internet, or data broadcasting.

In addition, the present invention may be a computer system including a microprocessor and a memory where the above-mentioned computer program is recorded in the memory, and the microprocessor operates in accordance with the computer program.

In addition, the program or the digital signal may be recorded in the recording medium and transferred, or the program or the digital signal may be transferred via the network so as to be executed by an another independent computer system.

INDUSTRIAL APPLICABILITY

The present invention may be applied to a power control device or the like. Particularly, the present invention may be applied to a power control device or the like which supplies stable power to a load.

REFERENCE SIGNS LIST 101, 106, 1601, 1606 Power Source
102, 1602-1613, 1617 Voltage Detection Unit
103, 1603 Capacitor
104, 1604 Load
105, 105A, 1605 Cooperative ECU (power control device)
107, 107a, 107b, 107n, 1607, 1607a, 1607b Power Storage Device
108 Positive Polarity Power Line
109 Negative Polarity Power Line
110, 111, 112 Network
113, 113a, 113b, 113n Appliance
201, 201A, 1701 Acquisition Unit
202, 202A Determination Unit
203, 203A Designated Value Informing Unit
204 Power Distribution Ratio Calculation Unit
301 Current Control Calculation Unit
302, 1614 DC/DC Conversion Unit
303 Quantity-of-state Detection Unit
304 Power Storage Battery
305, 1612, 1616, 1618 Current Detection Unit
310 Current Control Unit
702, 704 Elapsed Time
706 Terminal Voltage
712, 714 Remaining Capacity
1615 DC/AC Conversion Unit
1705 DC-AC Control Signal Calculation Unit
1706 DC-DC Control Signal Calculation Unit for PV

The invention claimed is:

1. A power control device comprising:
an acquisition unit that acquires voltage information and deterioration information, the voltage information indicating a voltage applied to a capacitor provided between a power generation unit and a load via a first power supply line and a second power supply line, the deterioration information indicating a state of deterioration of a storage battery connected to the power generation unit via the first power supply line and the second power supply line;
a determination unit that compares the voltage information acquired by said acquisition unit with a predetermined reference voltage so as to detect a fluctuation of the voltage applied to the capacitor, and determines power to be outputted by the storage battery, so as to suppress the fluctuation of the voltage applied to the capacitor; and
an informing unit that informs the storage battery of a current value corresponding to the power to be outputted by the storage battery,
wherein said determination unit detects the state of deterioration of the storage battery using the deterioration information acquired by said acquisition unit, and adjusts a charge time or a discharge time of the storage battery in accordance with the state of deterioration of the storage battery.

2. The power control device according to claim 1, wherein said determination unit determines power to be outputted per unit of time in accordance with the state of deterioration of the storage battery.

3. The power control device according to claim 1, wherein the deterioration information is calculated as a value corresponding to at least one of a voltage value and a temperature value of the storage battery.

4. The power control device according to claim 3, wherein said acquisition unit acquires the deterioration information containing the at least one of the voltage value and the temperature value of the storage battery each time the storage battery outputs a current in response to receiving the current value, until a fluctuation of the voltage applied to the capacitor is eliminated, and
said determination unit updates a charge amount of the storage battery and a state of deterioration of the storage battery each time said determination unit acquires the deterioration information.

5. The power control device according to claim 1, wherein the determination unit determines power to be outputted by the storage battery, in such a manner that the charge time or the discharge time is increased as the state of deterioration of the storage battery becomes worse.

6. The power control device according to claim 1,
wherein a plurality of storage batteries, each of which is the storage battery, are connected in parallel to the first power supply line and the second power supply line,
said acquisition unit acquires a voltage value from each of the storage batteries,
said determination unit further calculates a value corresponding to State of Charge (SOC) of each storage battery from the acquired voltage value of the storage battery,
said power control device further comprises a power distribution ratio calculation unit that calculates a distribution ratio of power to be outputted by each storage battery, in accordance with a ratio of the value corresponding to the SOC among the storage batteries, and
said informing unit calculates the current value for each of the storage batteries based on the power to be outputted by the storage battery and the distribution ratio calculated by said power distribution ratio calculation unit, and informs storage battery of the calculated current value, the power being determined by said determination unit, and the storage battery corresponding to the calculated current value.

7. The power control device according to claim 6,
where said determination unit determines an upper limit of power to be outputted by each of the storage batteries, in accordance with a state of deterioration of a storage battery with a highest temperature among the storage batteries.

8. The power control device according to claim 1,
wherein the power generation unit is a power generation system using green energy,
the load includes an AC load,
a DC/DC conversion unit which converts the green energy to DC power is connected between the power generation unit and the capacitor,
a DC/AC conversion unit which converts the DC power outputted from the DC/DC conversion unit to AC power is connected between the capacitor and the load,
said acquisition unit further acquires power values outputted by the DC/DC conversion unit and the DC/AC conversion unit, and
said determination unit determines power to be outputted by the storage battery so as to suppress a difference between the power values outputted by the DC/DC conversion unit and the DC/AC conversion unit.

9. A power supply system comprising:
a power generation unit;
a load to which an electric appliance is connected;
a power storage device that accumulates power generated by said power generation unit, and supplies power to said load; and
a power control device that performs a charge control or a discharge control of said power storage device, said power control device and said power storage device being connected to each other via a network,
wherein said power control device includes:
an acquisition unit that acquires voltage information and deterioration information via the network, the voltage information indicating information of a voltage applied to a capacitor provided between said power generation unit and said load via a first power supply line and a second power supply line, the deterioration information indicating a state of deterioration of a storage battery included in said power storage device and connected to said power generation unit via the first power supply line and the second power supply line;
a determination unit that compares the voltage information acquired by said acquisition unit with a predetermined reference voltage so as to detect a fluctuation of the voltage applied to the capacitor, and determines power to be outputted by the storage battery so as to suppress the fluctuation of the voltage applied to the capacitor; and
an informing unit that informs the storage battery of a current value corresponding to the power to be outputted by the storage battery,
wherein said determination unit detects the state of deterioration of the storage battery using the deterioration information acquired by said acquisition unit, and determines power to be outputted by the storage battery by adjusting a charge time or a discharge time of the storage battery in accordance with the state of deterioration of the storage battery, and
said power storage device includes:
the storage battery;
a current controller that controls a current to be charged or discharged to or from the storage battery in response to receiving the current value from said power control device; and
a detection unit that detects deterioration information indicating the state of deterioration of the storage battery so as to transmit the deterioration information to said power control device,
wherein said determination unit included in the power control device detects the state of deterioration of the storage battery using the deterioration information acquired by said acquisition unit, and adjusts a charge time or a discharge time of the storage battery in accordance with the state of deterioration of the storage battery.

10. A method for controlling power, comprising:
acquiring, using a processor, voltage information and deterioration information, the voltage information indicating information of a voltage being applied to a capacitor provided between a power generation unit and a load via a first power supply line and a second power supply line, the deterioration information indicating a state of deterioration of a storage battery connected to the power generation unit via the first power supply line and the second power supply line;
comparing, using the processor, the voltage information acquired in said acquiring with a predetermined reference voltage so as to detect a fluctuation component of the voltage applied to the capacitor;
determining, using the processor, power to be outputted by the storage battery so as to suppress a fluctuation of a voltage applied to the capacitor; and
informing, using the processor, the storage battery of a current value corresponding to the power to be outputted by the storage battery,
wherein in said determining, the state of deterioration of the storage battery is detected using the deterioration information acquired in said acquiring, and a charge time or a discharge time of the storage battery is adjusted in accordance with the state of deterioration of the storage battery.

11. A non-transitory computer readable recording medium on which a program is recorded, the program causing a computer to execute the method for controlling power according to claim 10.

* * * * *